United States Patent [19]

Kean et al.

[11] Patent Number: 5,737,235

[45] Date of Patent: Apr. 7, 1998

[54] FPGA WITH PARALLEL AND SERIAL USER INTERFACES

[76] Inventors: Thomas A. Kean, 130/10 Calton Road, Edinburgh, Scotland, EH88JQ; William A. Wilkie, 96 Braid Road, Edinburgh, Scotland, EH106AP

[21] Appl. No.: 465,032

[22] Filed: Sep. 6, 1995

[30] Foreign Application Priority Data

May 2, 1995 [GB] United Kingdom .................. 9508932

[51] Int. Cl.[6] .......................... G06F 17/50; H03K 19/173
[52] U.S. Cl. ............................................. 364/490; 326/38
[58] Field of Search ...................... 364/488, 489, 364/490, 491; 326/38, 39, 41, 47, 101; 395/309, 500

[56] References Cited

U.S. PATENT DOCUMENTS

| | | | |
|---|---|---|---|
| Re. 34,363 | 8/1993 | Freeman | 307/465 |
| 5,056,015 | 10/1991 | Baldwin et al. | 364/200 |
| 5,187,393 | 2/1993 | El Gamal et al. | 307/465.1 |
| 5,343,406 | 8/1994 | Freeman | 364/490 |
| 5,347,181 | 9/1994 | Ashby et al. | 307/465 |
| 5,359,536 | 10/1994 | Agrawal et al. | 364/489 |
| 5,394,031 | 2/1995 | Britton et al. | 326/38 |
| 5,457,410 | 10/1995 | Ting | 326/41 |
| 5,465,056 | 11/1995 | Hsieh et al. | 326/41 |
| 5,493,239 | 2/1996 | Zlotnick | 326/38 |
| 5,510,730 | 4/1996 | El Gamal et al. | 326/41 |
| 5,572,148 | 11/1996 | Lytle et al. | 326/41 |

FOREIGN PATENT DOCUMENTS

WO94/10754  11/1993  WIPO  .......................... H03K 19/177

OTHER PUBLICATIONS

Betty Prince, "Semiconductor Memories", copyright 1983, 1991, John Wiley & Sons, pp. 149–174.

Primary Examiner—Kevin J. Teska
Assistant Examiner—Leigh Marie Garbowski
Attorney, Agent, or Firm—Edel M. Young

[57] ABSTRACT

A configuration structure for a field programmable gate array (FPGA) allows a user to reconfigure or partly reconfigure the FPGA from within the FPGA, allows an addressable configuration memory to be addressed in parallel through a set of address and data or through a serial interface. Signals such as chip-enable and other control signals can be modified by user logic so that data loaded through a serial interface pin is entered into an addressed portion of configuration memory. The configuration memory programs not only the internal circuitry accessed by the user but also a programmable switch for directing signals between external pins, configuration memory control lines, and a serial data interface. Providing both parallel and serial interfaces allows a programmable switch which is initially configured to connect its related pad or pads to configuration control lines such as a chip enable line or a serial data input line to later be configured to connect an internally generated signal or signals to the line or lines and thus override any external signal which would have been connected to that line or lines.

10 Claims, 25 Drawing Sheets

Master-Slave Serial Configuration

5,737,235

FPGA WITH PARALLEL AND SERIAL USER INTERFACES

FIELD OF THE INVENTION

The invention relates to integrated circuits, more particularly to field programmable logic devices (FPGAs) having a programmable core of logic, a configuration memory for programming the core logic, logic for programming the configuration memory, and pad drivers for interfacing to external pads and pins.

BACKGROUND OF THE INVENTION

Reprogrammable FPGAs have been available commercially for several years. The best known commercial family of FPGAs are those from Xilinx, Inc. One class of these devices uses Static Random Access Memory (SRAM) cells to hold control bits which control their configurations. Each SRAM cell controls one or more transistors at the configurable points in an FPGA or serves as one or more entries in a lookup table. (The configuration memory cells collectively determine what functions the FPGA will implement.)

The present invention will be described in connection with SRAM FPGAs. The configuration of the FPGA is typically loaded from a non-volatile configuration memory into the SRAM configuration memory cells when power is applied to the system.

Some commercially available SRAM FPGAs have a stream-based interface to the SRAM configuration memory. That is, a stream of data is applied to one or a few pins in the FPGA and shifted in through a shift register to destination SRAM cells to provide a configuration for the whole device or for a sub-section of the FPGA. This stream-based interface provides an efficient method of loading the complete device configuration from an external source without any additional overhead circuits such as row and column decoders. In prior art stream-based FPGAs, the locations of the destination SRAM cells are not individually addressable. For some stream-based interfaces, in order to make any changes in the configuration, an entire section of the configuration memory must be re-loaded.

Other SRAM FPGAs are RAM addressable, and use data and address lines each connected to a separate external pin to access the configuration memory in a way similar to that used to access any random access memory. With an addressable configuration memory, an external processor can perform word-wide read or write operations on the registers of the user's design without having to re-load other parts of the configuration data. In such systems, a small portion of the configuration memory can be changed rapidly, and the remaining configuration memory may remain undisturbed. Thus the configuration memory interface allows high bandwidth (high speed) communication between the processor and the FPGA. Such systems may provide mechanisms for synchronizing computations between the FPGA and a processor outside the FPGA, and provide a mechanism to support dynamic reconfiguration. In dynamic reconfiguration, partial reconfiguration occurs while the remainder of the FPGA is in use. These systems still allow use of conventional design tools to create FPGA configurations for static designs.

Configuration information may be loaded from a variety of sources, for example, from the memory accessed by a microprocessor, from a non-volatile PROM under control of the FPGA itself (see description in Freeman, U.S. Reissue Pat. No. 34,363), or by mapping the FPGA configuration memory into the address space of the microprocessor.

Partial reconfiguration may also occur from within some known FPGAs. Freeman in U.S. Pat. No. 5,343,406 describes a lookup table FPGA in which the lookup tables which generate combinatorial functions can be loaded both from an externally supplied configuration bit stream and from the interconnect wiring within the FPGA. Thus partial reconfiguration of these FPGA chips can occur. Such FPGA chips are available from Xilinx, Inc. as the XC4000 series FPGA chips.

Several goals are important to consider when designing an FPGA. Since package pins on an FPGA are limited, it is important that loading the configuration information require as few dedicated package pins as possible in order to leave as many pins as possible for user input and output after the FPGA has been configured. (Using certain pins for loading data during configuration and then making them available for another purpose after configuration does not limit the number of pins available for user logic.) Also, the structure of the FPGA should require that as few additional components as possible be added to the board in which the FPGA is to be placed. (One purpose of using an FPGA is to reduce board part count). It is also important to some users that the FPGA configuration structure allow for partial and fast reconfiguration. It is further beneficial for a user to be able to access internal gates and registers during operation. (A system for allowing a user to access internal gates and registers during operation is described in Patent Cooperation Treaty patent application serial No. WO 94/10754 published 11 May 1994.

Present FPGAs attempt to meet these conflicting goals by providing a variety of programming modes (serial bit stream load, parallel bit stream load, loading under control of a microprocessor, etc.). Offering these options requires a relatively complex set of programming logic on the FPGA. Some modes require more pins and others require more programming time. For example, serial mode uses only one data pin whereas parallel mode may require 8 or 16 data pins. But serial mode takes at least 8 or 16 times as long to load the configuration. Not all the pins used during configuration are dedicated to that purpose. However, selecting between these modes has required dedicating a set of pins on the FPGA to selecting the mode.

In present RAM addressable FPGAs some of the pins of the FPGA are dedicated to address lines, data lines, and other control lines for loading the configuration memory, while other pins are dedicated to input and output of user logic. FIG. 1 shows such an FPGA chip and the relationships between external pads, the FPGA user logic structures, and the configuration memory which configures the user logic. It is convenient to visualize the FPGA as formed in first and second stories, a first story holding the configuration information which selects the functions performed by the FPGA, and a second story which performs the function selected by the user. FIG. 1 illustrates the FPGA in this manner. (Physically, the configuration memory and the user logic are formed on the same substrate of an integrated circuit structure This structure is described in PCT application serial No. WO 94/10754 published May 11, 1994.)

As shown in FIG. 1, some of the pads are for accessing user logic 19 and others are for addressing and loading configuration memory 25. The pad drivers 18 are configured by a user-generated enable signal to determine whether a particular user logic pad 16 is an input pad, an output pad, or unused. Switches such as switch 15 are configured by the underlying configuration memory 25 to transfer signals between the pad drivers 18 and the internal user logic 19. Such internal user logic is discussed in detail by the present inventor in Patent Cooperation Treaty patent application serial No. WO 94/10754 published 11 May 1994. Pads R0 through R3, R/W, CE, CK, RST, C0 through C2, D0 through D7 and their related pins (not shown in FIG. 1) are dedicated to the configuration function. A commercially available device typically has more pads for both configuration and user logic than shown in FIG. 1.

Configuration memory 25 is loaded by addressing a memory cell or memory word as is done in a conventional RAM. Row and column address busses 22 and 27 carry address signals which are decoded by row and column decoders 21 and 26, and connect a selected word of configuration memory 25 to configuration data bus 23 to be read or written. Pads D0 through D7 are coupled to configuration data bus 23.

FIG. 2 shows the relationship between the address and data busses, the row and column decode structures, the eight bit drivers associated with each word, and the data locations in the configuration memory array 25. Such structures are well known in the art. Betty Prince in "Semiconductor Memories" © 1983, 1991 by John Wiley & Sons discusses such structures at pages 149–174.

Also shown in FIG. 1 is memory load control unit 24. Control unit 24 enables row and column decoders 21 and 26 in response to well known clock, chip enable, and reset signals from pads CE, CK, and RST respectively. Memory control unit 24, in response to a read/write signal on pad R/W, determines whether pads D0 through D7 will have an input configuration for writing or an output configuration for reading data bus 23.

If the structure of FIG. 1 is to be reconfigured or partially reconfigured during operation, an external device such as a microprocessor addresses portions of the configuration memory and loads new data into those locations.

FIG. 3A shows the relationship between parts of the FPGA user logic of FIG. 1, namely a pad 16, the related pad driver 18, and a switch 15 in the user logic. In FIG. 3A, switch 15, which in FIG. 3A is located at the east edge of the FPGA, sends and receives signals between user logic at the left and the external pad 16 and pin 17 at the right. Lines extending to the left of switch 15 are of three different lengths as indicated by their numerical representation. For example, line E16B is 16 cells long and carries signals in the east direction, line E4B is four cells long going east, and line EB is one cell long going east. Line WB is one cell long going west.

Such a hierarchy of line lengths is shown in FIG. 3B, where line 34 is 16 cells long (only partly shown) going east, line 26 is four cells long going east, line 22 is one cell long going east and line 24 is one cell long going west. Switches 19 and 20 in the interior core of the user logic shown in FIG. 3B comprise a plurality of multiplexers each programmable by bits in the configuration memory 25 (see FIG. 1) to connect their input and output signals as desired by a user. This is discussed in more detail in PCT patent application publication number WO 94/10754 mentioned above.

FIG. 4 shows the internal structure of the pad driver 18 and the related switch of FIG. 3A. As shown in FIG. 4, switch 15 includes eight multiplexers 41 through 48, each for providing one of the output signals WB, W4B, W16B, WA, W4A, W16A, EN, and OUT. Input signals to these eight multiplexers are selected from the east-going input signals E16B, E4B, EB, E16A, E4A, EA, and the pad signal PADIN provided by pad driver 18.

Also shown in FIG. 4, pad driver 18 includes tristate output buffer 78 for providing output signal OUT to pad 16 under control of enable signal EN. The slew rate (switching speed) of output buffer 78 is also selectable by the user through memory cell SLEW. If pad driver 18 is configured to serve as an input driver, EN is set to make buffer 78 inactive. In the event that the chip is put into a package in which no pin 17 is connected, pullup control transistor TPUP is turned on by memory cell PUP to connect pullup resistor RPUP to the input terminal of input buffer 79 so the input voltage will not float to an intermediate state and drain power.

In FIG. 4, dashed lines are used to indicate configuration memory cells which control multiplexers and transistors in the switch and pad driver. The dashes suggest that the configuration memory cells are not visible in the picture. One can envision the memory cells as on a lower plane, as discussed above in connection with FIG. 1. In some cases, the memory cell is not directly connected to the multiplexer or transistor as shown, but is gated, for example through an AND gate which typically receives a global enable input. Signals from the memory cells which control the pullup transistor and slew rate on the output buffer are typically gated, and enable multiplexer 47 is typically controllable to provide a disabling output signal regardless of the values in its configuration memory cells. Such gating structures are not shown but are well known.

As illustrated in FIG. 1, the same pad driver circuit 18 shown in FIG. 4 is used for address and data pads which access configuration memory 25. For address pads, since the address lines are input only, the enable line EN is tied to ground and the OUT line is tied to either power or ground.

It is desirable to allow a user to have more flexible access to the limited number of pads during operation. It is also desirable to allow a user to load configuration information during operation without sacrificing access to pads which were used for loading initial configuration information but are used during operation for other purposes.

SUMMARY OF THE INVENTION

The present invention allows the same pad to be used for both configuration and user interface, makes partial dynamic reconfiguration particularly convenient, and offers the user powerful new choices for controlling logic functions from within the FPGA and new choices for interfacing with structures outside the FPGA. It also allows the FPGA chip to be loaded with configuration information either from parallel address and data pins or from a serial data pin.

In accordance with the present invention, in an FPGA integrated circuit chip, a programmable switch is placed between the pins or pads of the chip and the internal circuitry of the chip. The internal circuitry includes logic which is accessed by a user during operation of the FPGA and configuration memory which controls the functions performed by the FPGA chip. In the present invention, the programmable switch adopts an initial state upon power-up to connect selected external pins to the configuration memory so that the configuration memory can be loaded. However, the configuration memory programs not only the internal circuitry accessed by the user but also the programmable switch itself. Thus as configuration proceeds, or after configuration is completed, the programmable switch can be reconfigured to connect signal lines of the FPGA user logic to lines for addressing or controlling the configuration memory which were initially loaded from external pins.

In particular, a programmable switch which is initially configured to connect its related pad or pads to configuration control lines such as a chip enable line or a serial data input line can later be configured to connect an internally generated signal or signals to the line or lines and thus override any external signal which would have been connected to that line or lines.

To provide for both parallel and serial configuration, in addition to the address and data pads which can be connected by programmable switches to internal address and data lines, additional pins are designated to select between serial and parallel loading and to control the serial loading. Internal to the FPGA chip, a serial-to-parallel interface structure is provided which can receive a serial bit stream comprising both configuration data and an address for the data, and apply the data to the addressed location just as if the data had been applied to external data pins. The programmable switch can be configured by the serial bit stream to change the source or destination of these serial bit stream control signals. For one example, one of the additional pins designated to control serial loading can be a "wait" pin, which is initially configured to receive an external wait signal and is later configured to override the wait signal with an internally generated signal when the serial bit stream is completed.

DETAILED DESCRIPTION OF SOME EMBODIMENTS OF THE INVENTION

Figure 5:
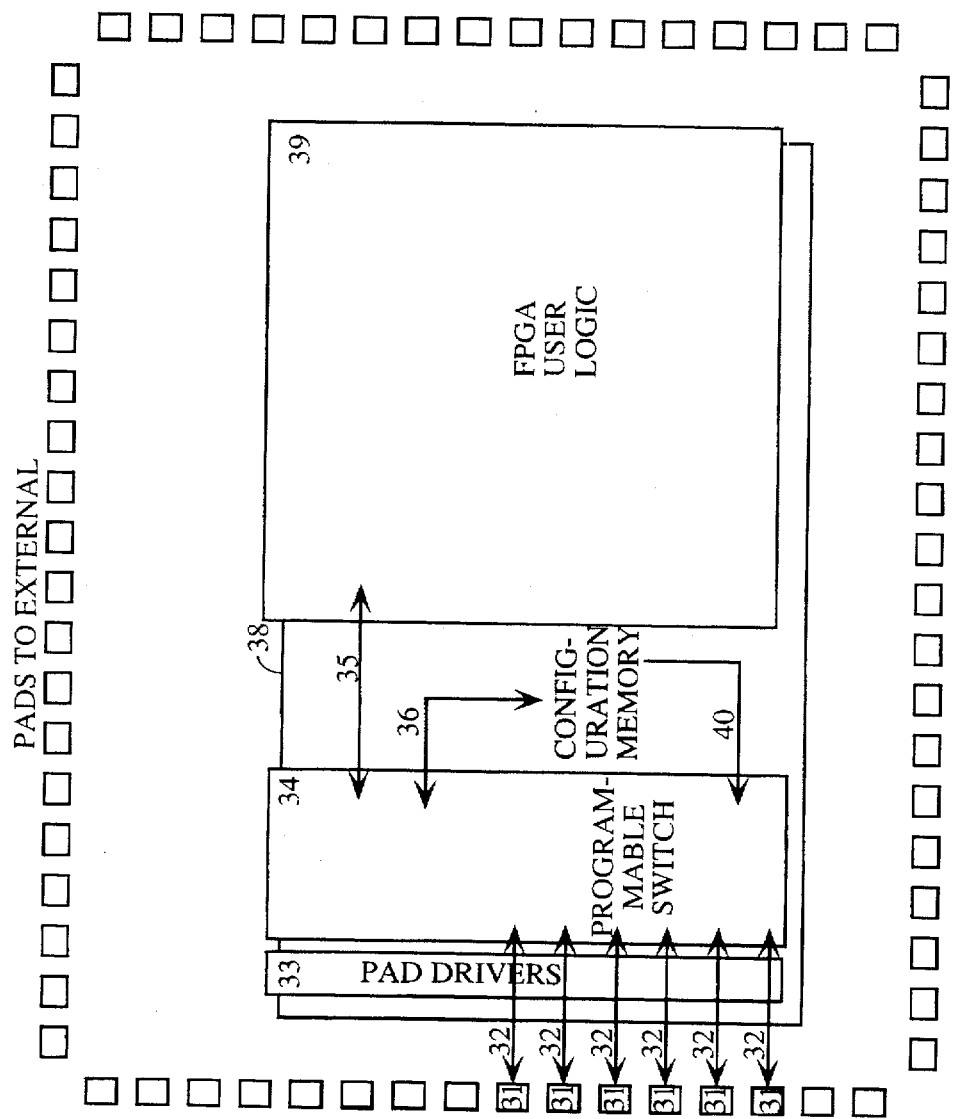
FIG. 5 shows a structural relationship between a pad, a pad driver, a portion of the FPGA core logic, and the FPGA configuration memory according to the invention, illustrating that the underlying configuration memory controls the pad drivers, the programmable switch and the user logic.

FIG. 5 shows one structural relationship between pads, a programmable switch, the FPGA user logic, and the configuration memory according to the invention. Programmable switch 34 can access both the configuration memory 38 and the user logic 39. Programmable switch 34 can send and receive data to and from user logic 39 as indicated by the bidirectional bus 35 and can also send and receive data from configuration memory 38 as indicated by bidirectional bus 36. FIG. 5 illustrates that the underlying configuration memory 38 controls the pad drivers 33, the programmable switch 34 and the user logic 39. The pads 31 and pad drivers 33 connect to programmable switch 34. Connections which programmable switch 34 can make include:

1. apply an input signal from a pad 31 to a line of bus 35 to the FPGA user logic 39, thereby allowing a user to apply an input signal to the FPGA user logic;
2. apply an input signal from a pad 31 to a line of bus 36 as a control line (address, data, chip enable, read/write, clock, etc. depending upon which pad is used) to configuration memory 38, thereby allowing external signals to change the configuration of user logic 39;
3. apply an input signal from a pad 31 to a line of bus 36 as a control line (address, data, chip enable, read/write, etc.) to configuration memory 38, thereby allowing external signals to change the configuration of the programmable switch itself;
4. take a user logic output signal applied to a line of bus 35 and apply it through one of pad drivers 33 to a pad 31 thereby providing a chip output signal;
5. read a value in configuration memory 38 onto a line of bus 36 and then apply it to an input terminal in FPGA user logic 39 via bus 35;

6. read a value in configuration memory 38 onto a line of bus 36 and apply it on a line 32 to a pad 31.
7. connect internal signal lines (word, bit) 40 which control configuration memory 38 through bus 35 to user logic 39;
8. take a user logic output signal applied to a line of bus 35 and apply it as one of several control signals for writing to a memory location in configuration memory 38, whereby user logic 39 changes the FPGA configuration;
9. perform a two-step process of applying an external signal via bus 35 to user logic 39, which applies a logic function of this signal to another line of bus 35, and use the output of this logic function to control configuration memory 38; and
10. apply an output signal from the configuration memory 38 via bus 36 to user logic 39, which modifies the signal, then apply the modified signal taken from bus 36 through a pad driver 33 to an output pad 31.

The above list is not exhaustive. Many other options are offered to an FPGA user by the novel switch 34.

Figure 3A:
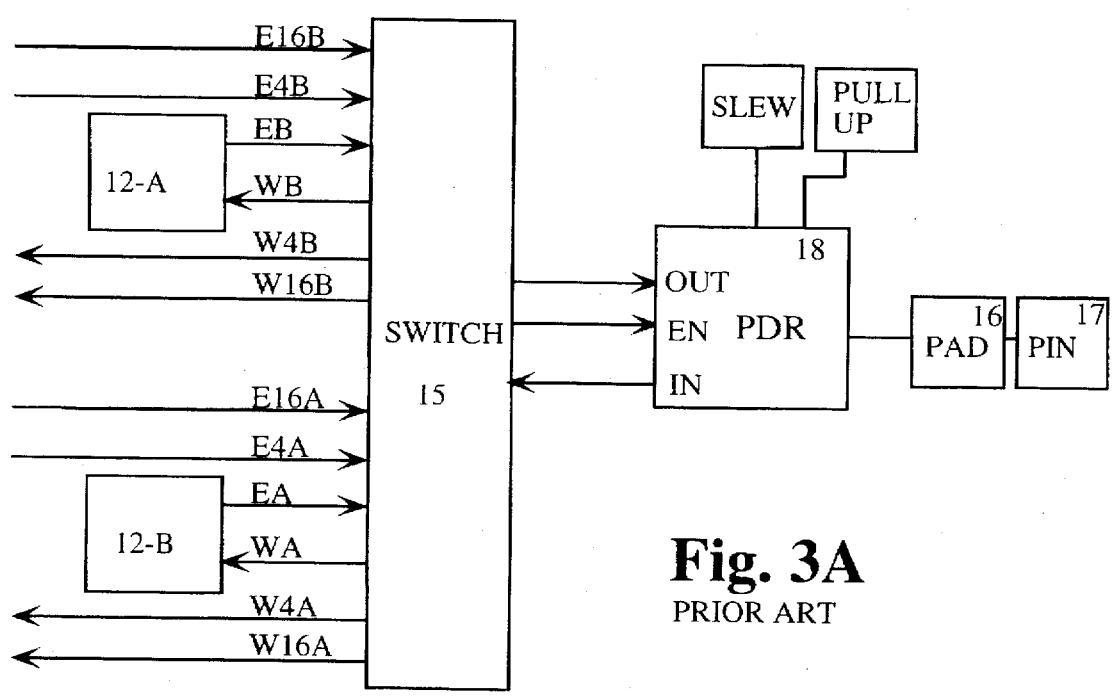
FIG. 3A shows the relationship between parts of the FPGA user logic of FIG. 1, namely a pad, the related pad driver, and a switch in the user logic.
Figure 3B:
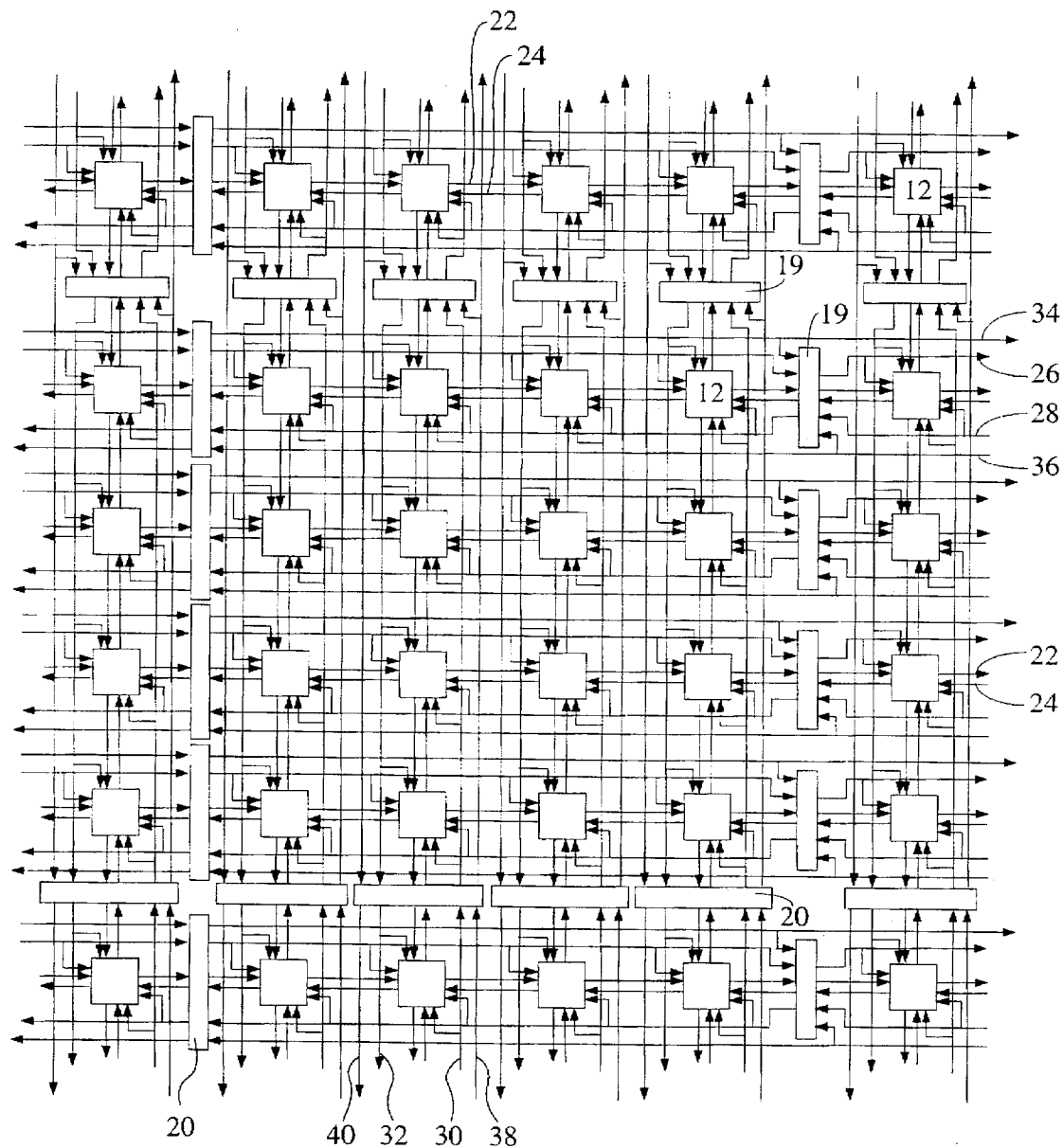
FIG. 3B shows a portion of user logic which may be used with the invention, illustrating a hierarchical interconnect structure.
Figure 4:
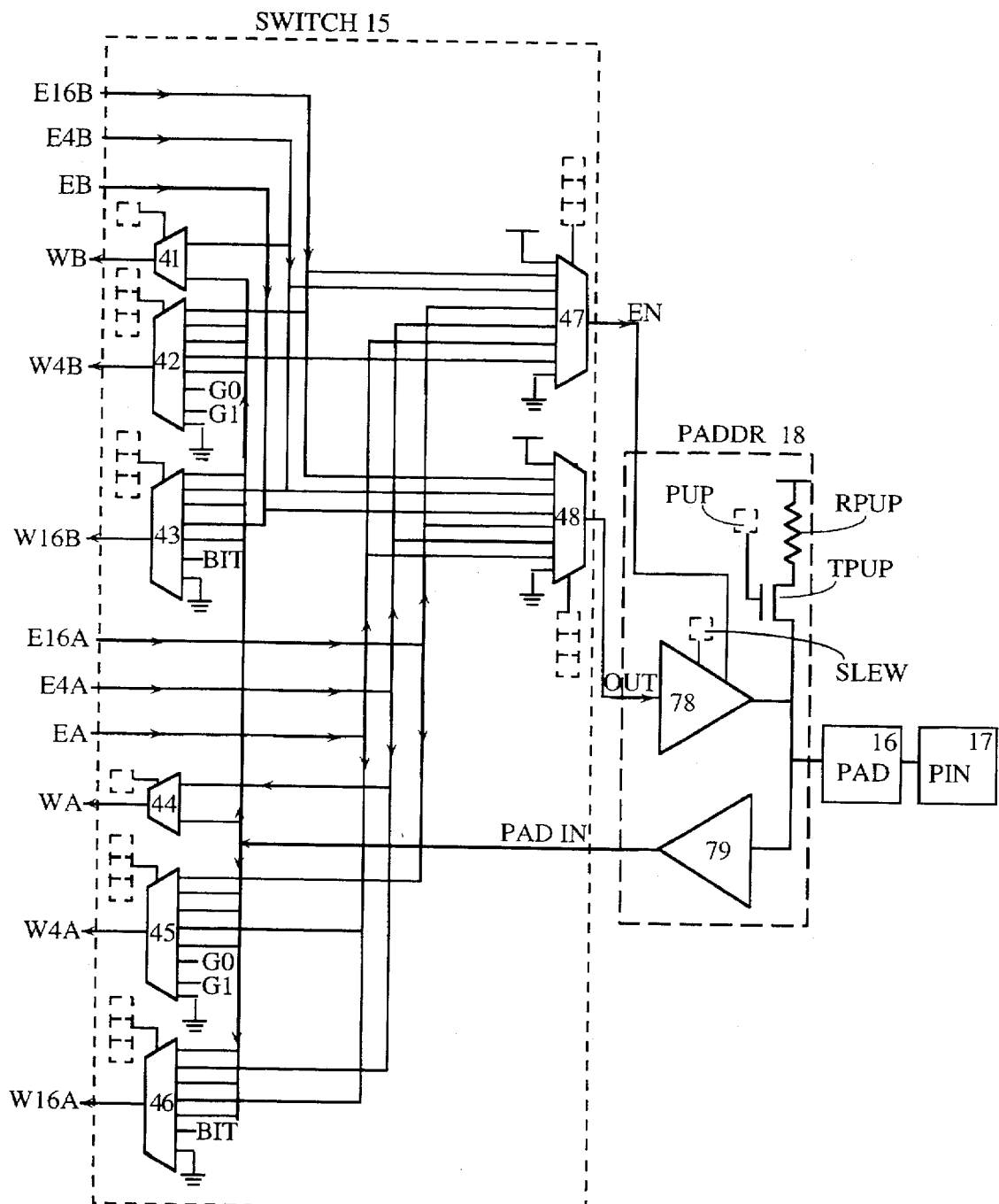
FIG. 4 shows the internal structure of the pad driver and the related switch of FIG. 3A.
Figure 6A:
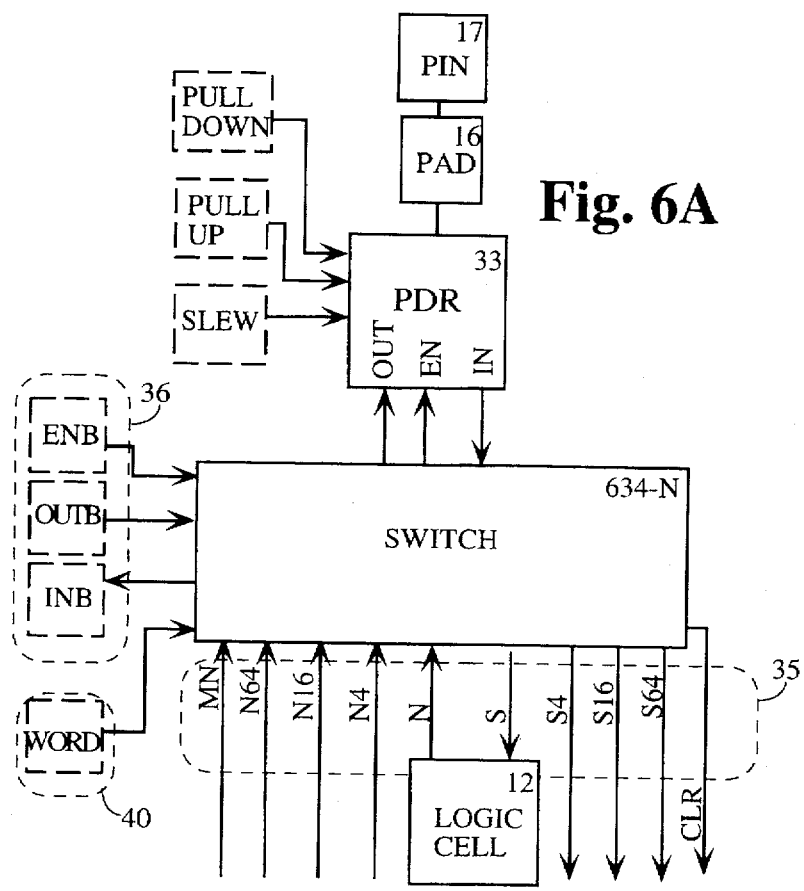
FIG. 6A shows the relationship between parts of the FPGA user logic of the invention, namely a pad at the north edge of the FPGA, the related pad driver, a programmable switch in the user logic, and signals accessed by the programmable switch.

FIG. 6A shows in more detail the relationship provided by the invention between parts of the FPGA, namely a pad at the north edge of the FPGA, the related pad driver 33, a programmable switch 634-N in the user logic, and signals accessed by the programmable switch 634-N. In the embodiment of FIG. 6A, switch 634-N is one of many switches which make up switch 34 of FIG. 5. Each connects to a separate pad 16. Pad driver 33 is controlled by three control signals PULL DOWN, PULL UP, and SLEW derived from three configuration memory cells, in a way similar to the structure of FIG. 4. Switch 634-N at the north edge of the chip receives three input signals derived from three lines which control the configuration memory. Signals INB in one embodiment can be used to provide a data signal on a data line which writes to the configuration memory and signal OUTB can be derived from that same data line. The ENB signal (which enables switch 634-N to forward signal OUTB, as will be shown below in connection with FIG. 6C) is derived from a control unit for controlling configuration memory in response to well-known signals such as clock, read/write, and chip enable signals. The WORD signal is derived from a word line in the configuration memory. In this embodiment, word lines extend vertically through the chip are accessed by switches at the north and south edges of the chip. Signal lines extending downward from switch 634-N connect to a user logic array such as shown in FIG. 3B. The embodiment of FIG. 6A differs from that of FIG. 3B in that it includes a fourth level of hierarchy having routing lines N64 and S64 which are 64 cells long. Additionally a line MN is of a length between one and four cells, and connects to a selected point in a four-cell block, as will be discussed in connection with FIGS. 9A and 9B.

Figure 6B:
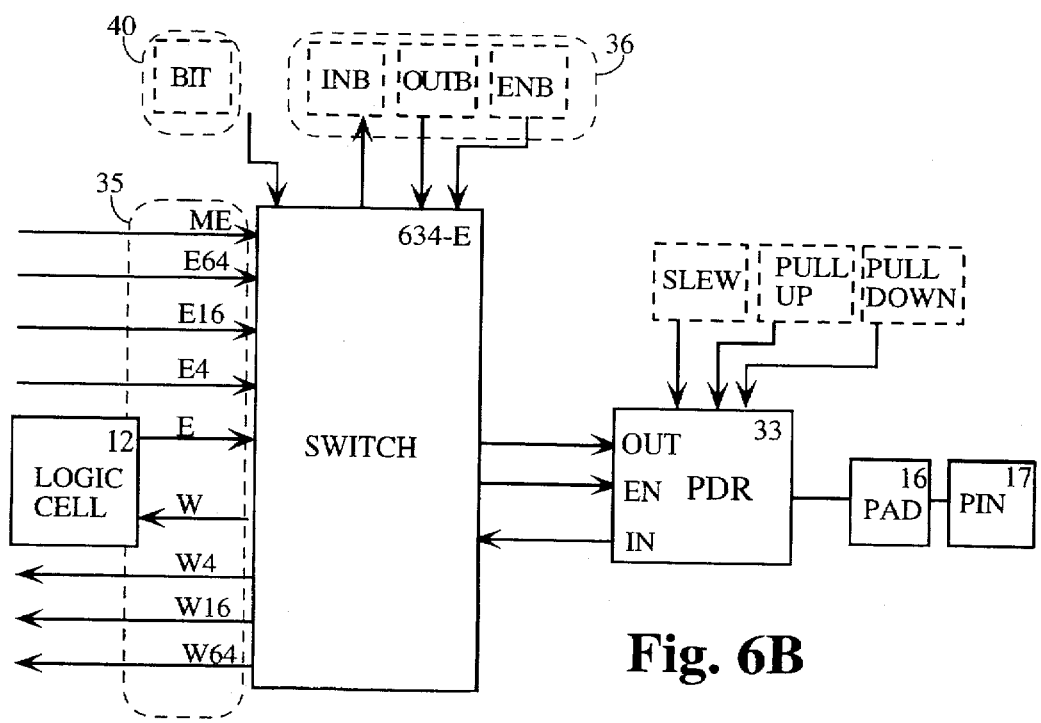
FIG. 6B shows the relationship between a pad at the east edge of the FPGA, the related pad driver, a programmable switch in the user logic, and signals accessed by the programmable switch.

FIG. 6B shows the relationship between a pad at the east edge of the FPGA, the related pad driver, a programmable switch in the user logic, and signals accessed by the programmable switch. In switch 634-E of FIG. 6B, signals from the programming structure include a bit line rather than a word line.

Figure 6C:
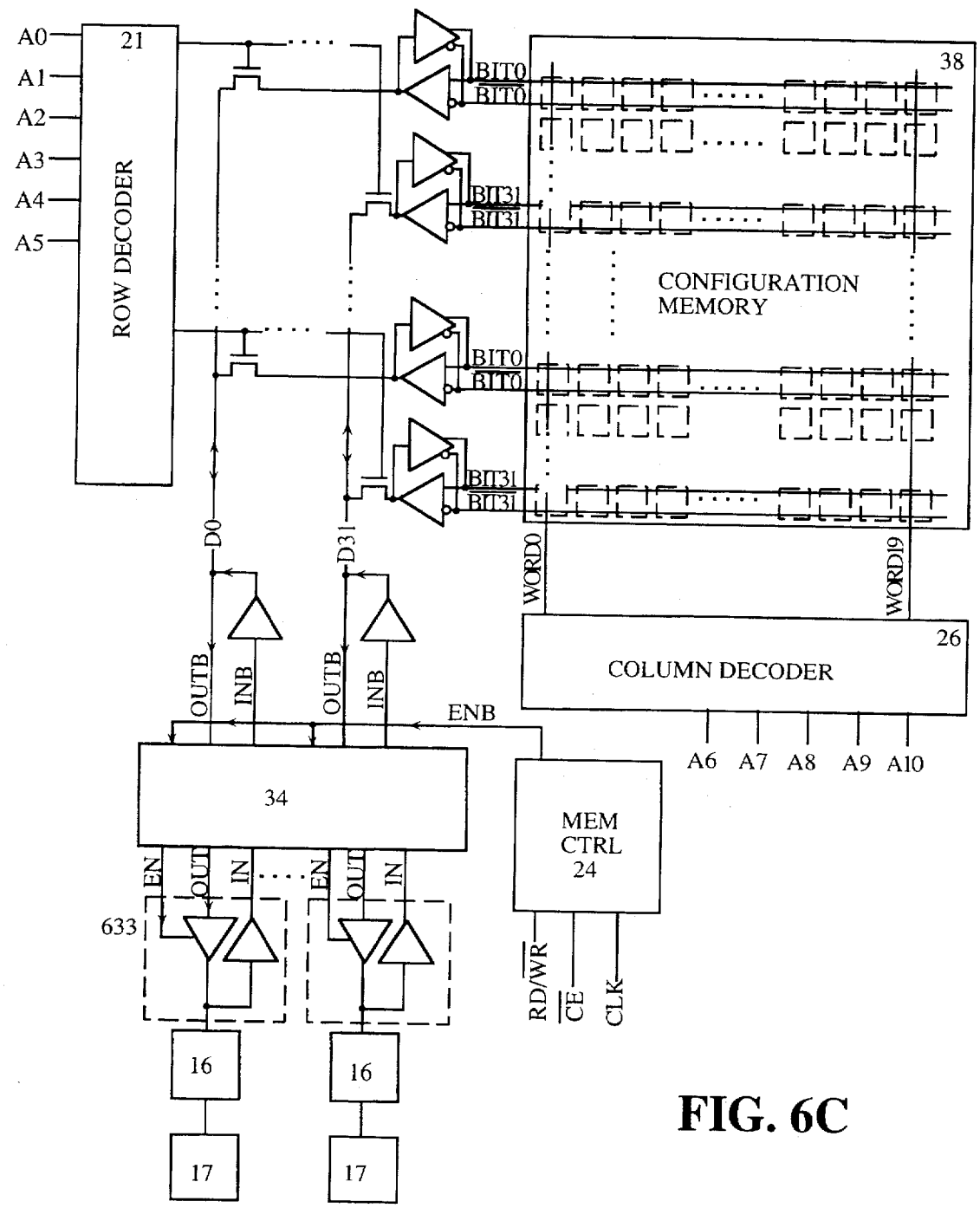
FIG. 6C shows the relationship between signals generated by the programmable switches of FIGS. 6A and 6B and the signal lines in the memory control structure which carry these signals.

FIG. 6C shows connections to the programming structure of the signals INB, ENB, OUTB, WORD, and BIT which were illustrated in FIGS. 6A and 6B. To access a bit or word in the configuration memory, many signals must work together. The configuration memory 38 of FIG. 6C includes words of 32 bits, each word being addressed by a row and column address. Address lines A0 through A5 address rows and address lines A6 through A10 address columns. Each combination of row and column addresses selects one 32-bit word. When a word is selected, the 32 bits of that word are read from or written to data lines D0 through D31. Each bit of the addressed word is read from a different line OUTB by a different switch 634 or written to a corresponding line INB by the corresponding switch 634.

Although FIGS. 6A through 6C show embodiments in which one switch 634 corresponds to one pad 16, other embodiments of switch 34 include lines which connect internal signals to more than one pad. Multiple switches 634 in FIG. 6C receive the same ENB input signal, and derive corresponding EN signals, one for each pad, for enabling pad driver output signals OUT.

Figure 7:
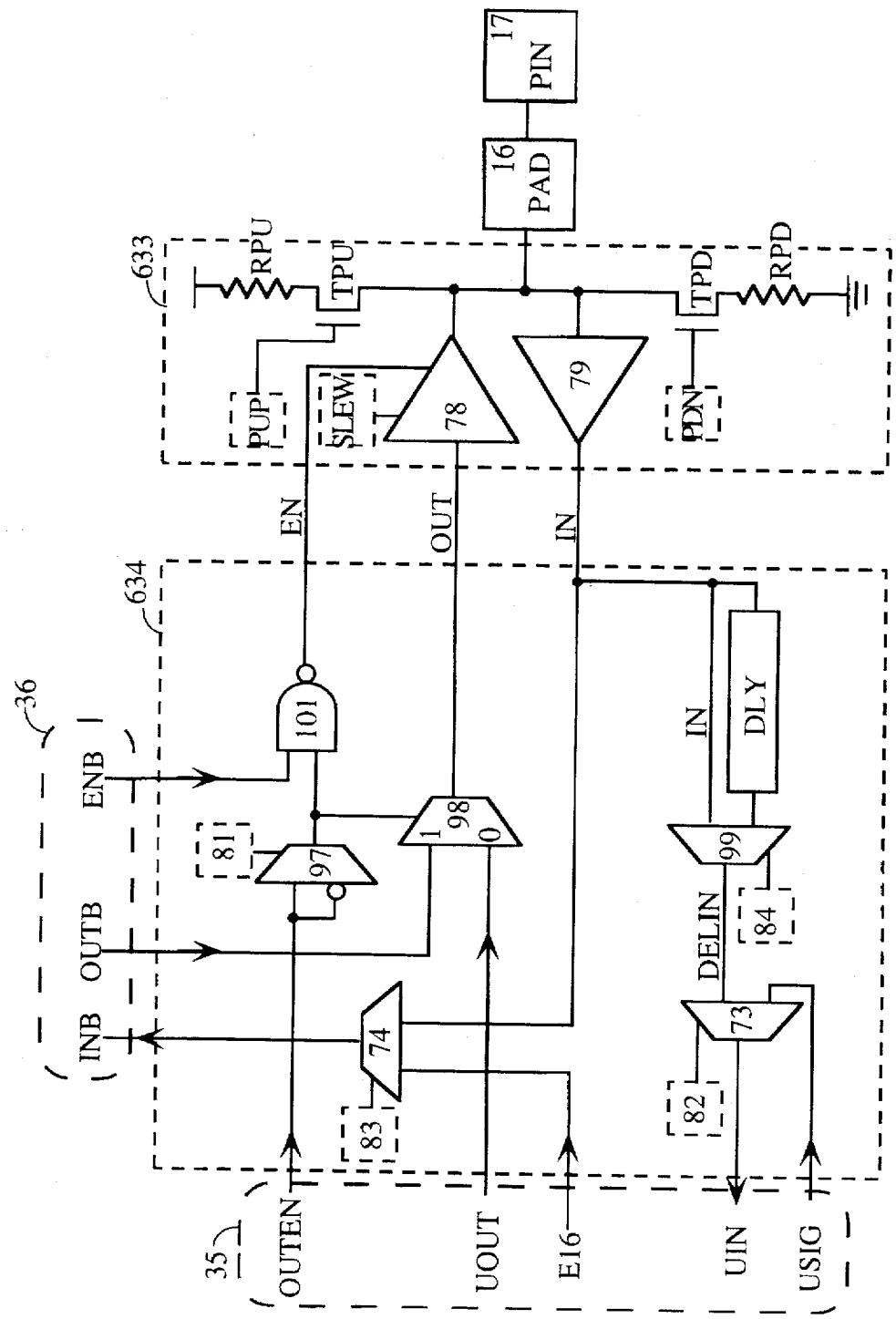
FIG. 7 shows a first embodiment of the pad driver and switch of the present invention.

First Embodiment, FIG. 7

FIG. 7 shows one embodiment of the pad driver and switch of the present invention. In this embodiment, a plurality of switches 634 are provided as part of programmable switch 34 of FIG. 5B, one switch 634 for every row or column of cells of user logic. (For cells, see FIG. 3B, cells 12.) Every switch 634 has the ability to route either a user logic signal or a control logic signal to or from pad 16. The control logic signals include chip enable, read/write, address, and data. This means that the pins and pads which provide these control signals during configuration after power-up are not necessarily used for addressing and loading configuration data but may also be used to interface with the user logic. Likewise, a signal generated by the user logic can be applied to one of the control inputs of the configuration memory.

Looking at FIG. 7, signal lines at the left connect programmable switch 634 to user logic and thus form part of bus 35 (see FIG. 5). Signal lines at the top of the figure connect to the control lines for addressing, reading, writing to configuration memory and thus form part of bus 36 of FIG. 5. Extending into switch 634 from bus 36, an enable signal ENB, which is generated by control logic for loading configuration memory 38 (see FIG. 6C), modifies a user output signal OUTEN through NAND gate 101 to generate the enable signal EN controlling output buffer 78. Since the OUTEN signal is generated by user logic, both the configuration control logic and the user's logic affects the value of the EN signal.

As shown in FIG. 7, output data signal OUTB on bus 36 is applied to multiplexer 98. User logic output signal UOUT is also applied to multiplexer 98. When the output enable signal OUTEN as optionally inverted by multiplexer 97 is logical zero, the user output signal UOUT is applied by multiplexer 98 as signal OUT through buffer 78 to pad 16. Thus pad 16 carries a signal generated by user logic 39. When the optionally inverted OUTEN signal from multiplexer 97 is logical one, if the control logic enable signal ENB is low (thus causing NAND gate 101 to generate a logical one EN signal) the configuration data output signal OUTB is applied to pad 16. If control logic enable signal ENB is high, pad 16 receives a high impedance if PUP and PDN are both zero and receives a constant if PUP or PDN is high.

Input line IN from pad driver 633 can be applied both to user logic via multiplexers 73 and 99 and to the configuration memory control structure via multiplexer 74. These three multiplexers 73, 74, and 99 are controlled by bits in the configuration memory (as suggested by the dashed lines around memory cells 82, 83, and 84). Multiplexer 99 can apply either a delayed version of the signal or a passed-through version of the signal to line DELIN as selected by configuration memory cell 84. Multiplexer 73 selects between signal DELIN and a user logic generated signal USIG from bus 35 and sends the selected signal UIN on bus 35 to user logic. Switch 634 can also apply the externally derived signal IN to bus 36 for use as a configuration memory control signal if configuration memory cell 83 has been programmed to forward this IN signal. Alternatively, memory cell 83 can cause one of the user logic signals E16 to be a control signal for configuration memory.

Figure 8:
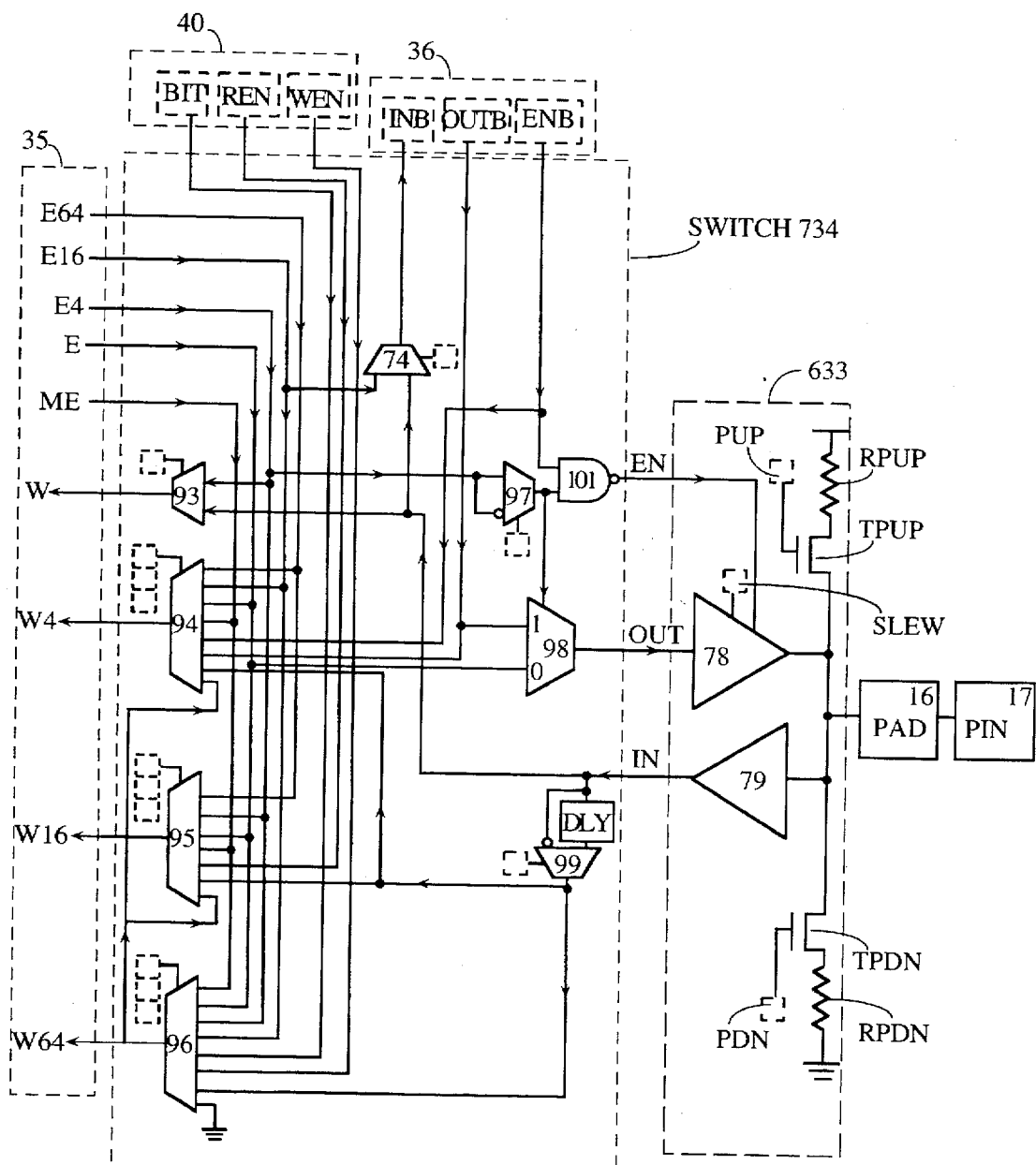
FIG. 8 shows a second embodiment of the programmable switch and pad driver of the present invention.
Figure 9A:
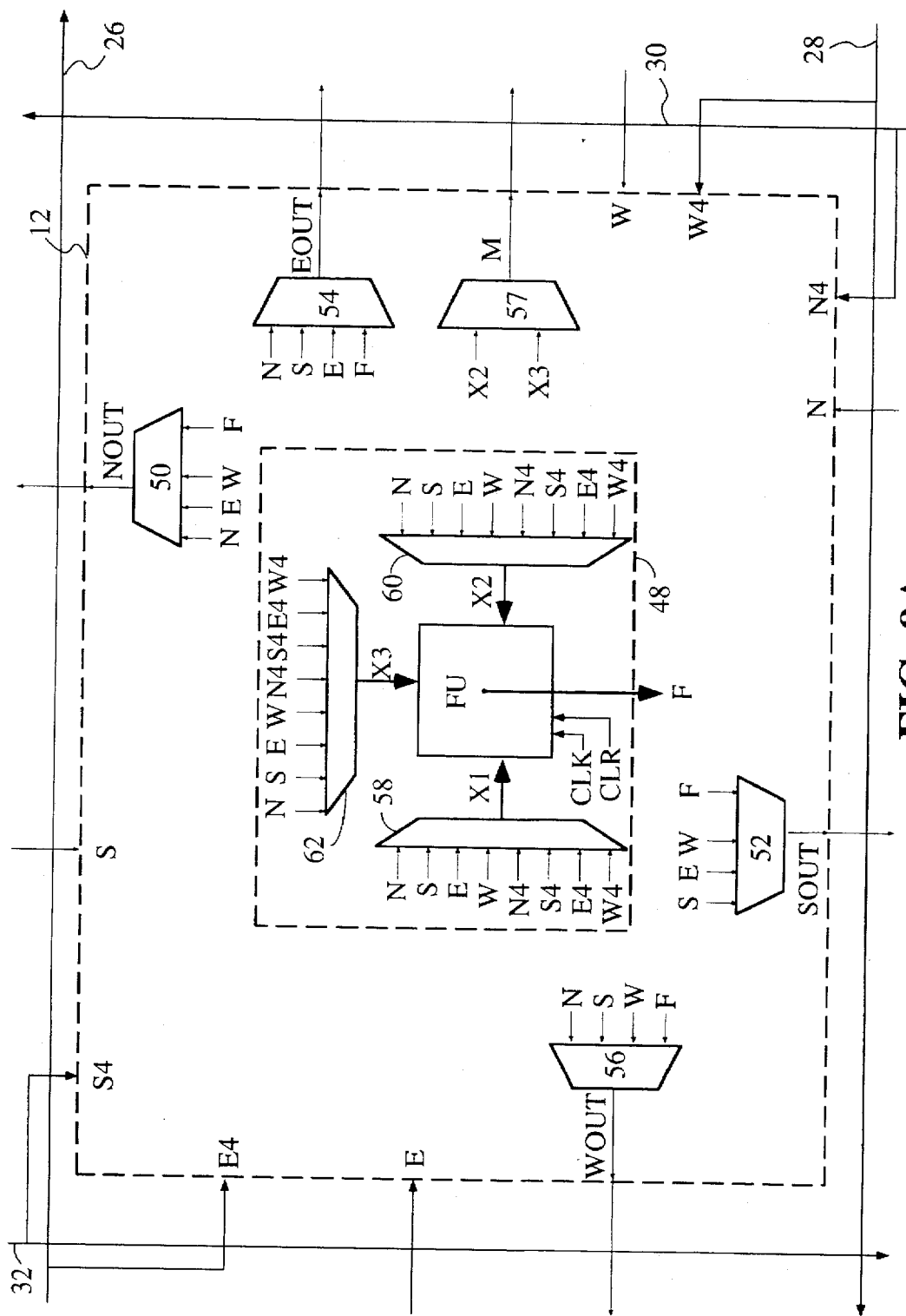
FIG. 9A shows a logic cell of the type which may be used in FIG. 3B and which may be used with the switch of the present invention.
Figure 9B:
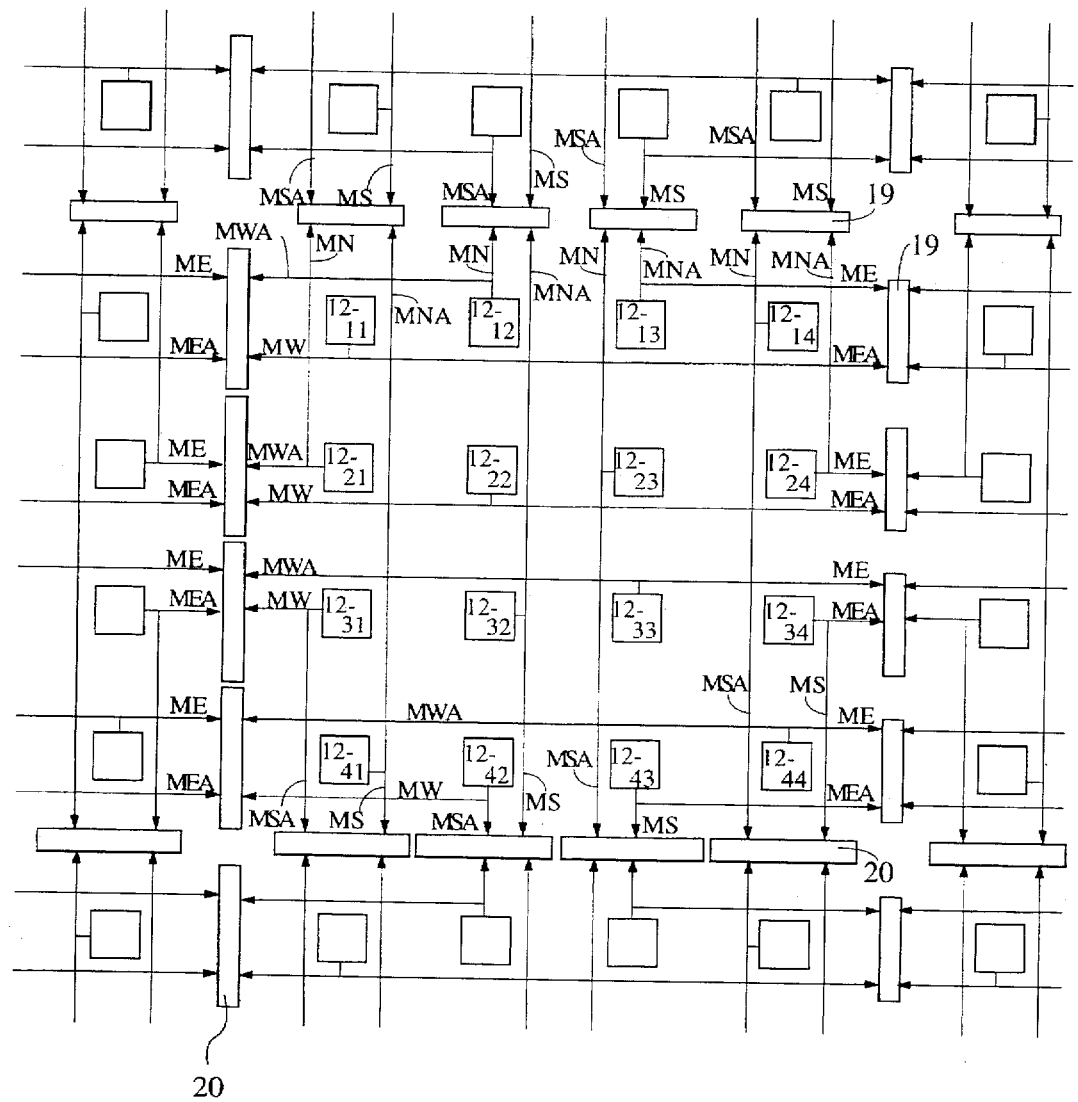
FIG. 9B shows a four-by-four cell block with the pattern of routing lines which connect the M output signals from multiplexer 57 of FIG. 9A to switches surrounding the four-by-four cell block.
Figure 9C:
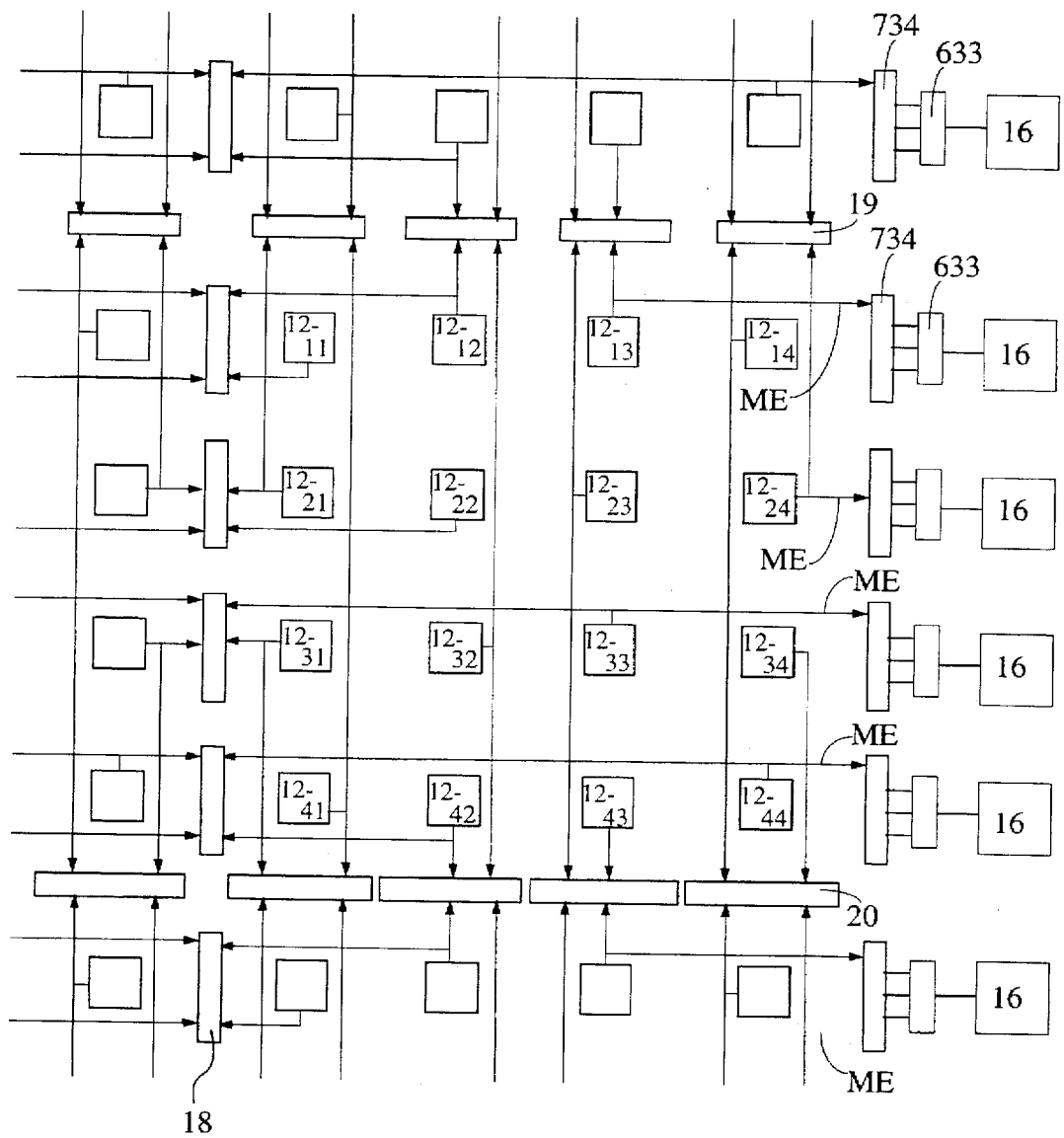
FIG. 9C illustrates the arrangement of ME signals provided to switches 734 at the east edge of the chip.
Figure 10:
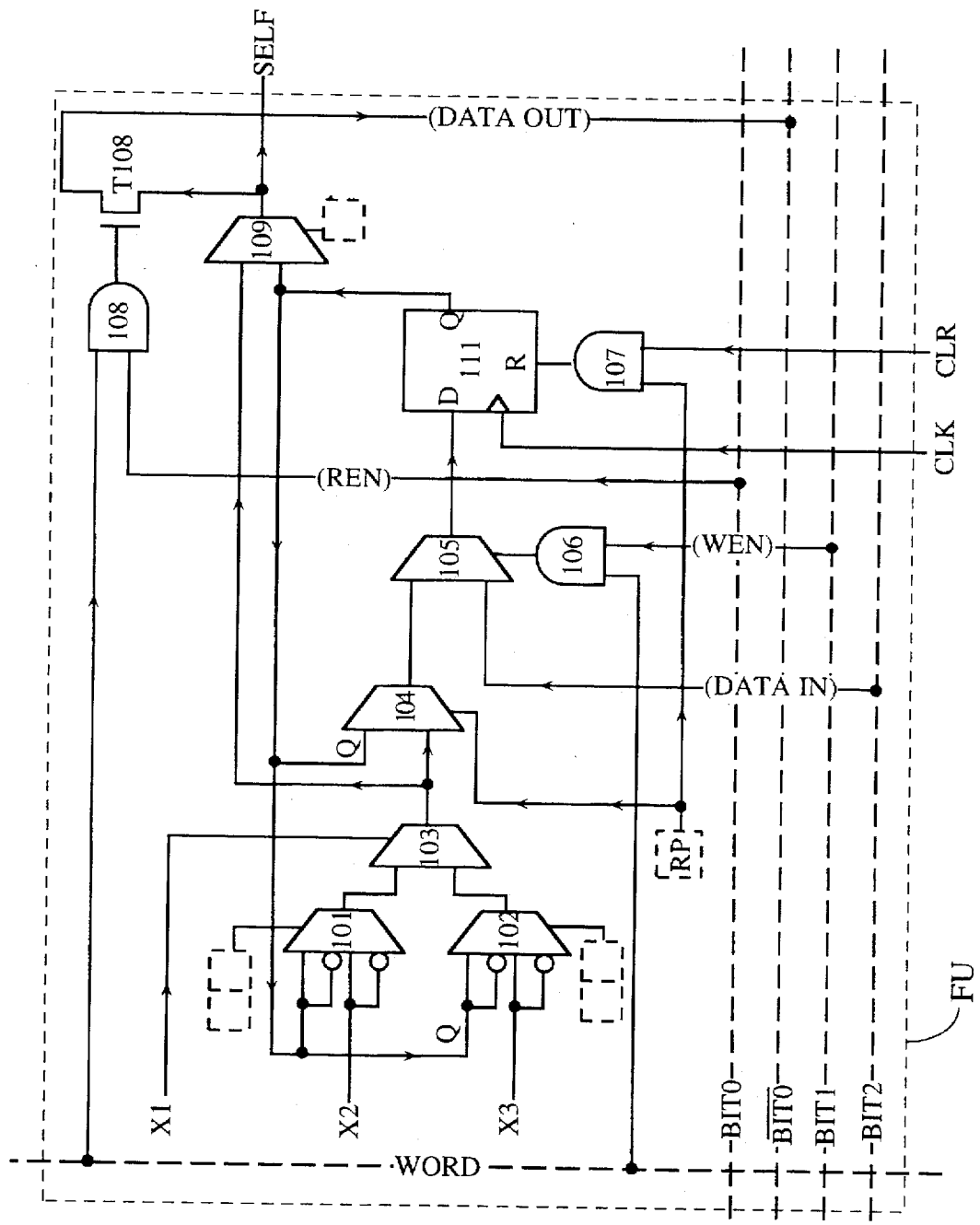
FIG. 10 shows a novel function unit which may operate in the logic cell of FIG. 9A.

Second Embodiment, FIGS. 8–10

The embodiment of FIG. 8 has the ability to interact with several signals for accessing the configuration memory through buses 36 and 40 as well as accessing several routing lines in the user logic through bus 35. The embodiment of FIG. 8 sits at the east edge of an FPGA logic structure having four levels of interconnect hierarchy. Multiplexers 93 through 96 drive west-going lines W, W4, W16, and W64 having lengths indicated by their suffixes and perform functions similar to multiplexer 73 of FIG. 7. East-going lines E, E4, E16, and E64 provide east-going signals on lines of the indicated lengths. East-going signal ME is of another length, in one embodiment one to four cells long (discussed below with reference to FIGS. 9A and 9B). Multiplexers of FIG. 8 having the same label as multiplexers of FIG. 7 perform the same function.

Bus 40 allows further interaction between the configuration memory control structure and the user logic. Bus 40 is best understood with reference to FIGS. 9A and 10. As is well known for memory structures, a plurality of bit lines extend perpendicular to a plurality of word lines for addressing, reading and writing an array of memory cells. In FIG. 10, word lines extend vertically, one of which, line WORD, is shown. Bit lines extend horizontally, four of which, BIT0, $\overline{BIT0}$, BIT1 and BIT2, are shown. Not only do the bit and word lines address configuration memory cells such as the multiplexer control memory cells indicated by dashed lines, these bit and word lines also are used in the structure of FIG. 10 to provide an alternative means of reading and writing to flip flops 111 which are part of the function unit FU in the preferred cell of FIG. 9A.

FIG. 9A shows one of the cells 12 illustrated in FIG. 3B. Three input multiplexers 58, 60, and 62 provide a selected input signal X1, X2, and X3 to function unit FU. Four output multiplexers 50, 52, 54, and 56 provide output signals going north, south, east, and west respectively. These output signals are derived from input signals from north, south, east and west as shown in FIG. 9A and also from the signal F, which is the output signal from function unit FU. Multiplexer 57 provides as an output signal the X2 or X3 signal and thus allows a signal coming in on one of the length-one or length-four lines to be provided as an output signal M.

FIG. 9B shows a four-by-four cell block and shows the pattern of routing lines which connect the M output signals from multiplexer 57 in a single cell of FIG. 9A to switches surrounding the four-by-four cell block. The destination of the M output signal of FIG. 9A depends upon where cell 12 is positioned within the four-by-four cell block. As shown in FIG. 9B, the M output signal from cell 12-11 at the upper left corner of a four-by-four cell group is provided to switches to the east and west of the four-by-four cell group. The M output signal from cell 12-12 is provided to switches to the north and west of the four-by-four cell group. The M output signal from cell 12-13 is provided to switches to the north and east of the four-by-four cell group. The M output signal from cell 12-14 is provided to switches to the north and south of the four-by-four cell group. In the second row, the M output signal from cell 12-21 is provided to switches to the north and west; from cell 12-22 to the east and west; from cell 12-23 to the north and south; and from cell 12-24 to the north and east. Similar sets of connections are provided for the third and fourth rows as shown. Thus, in the core of the chip, four M signals are provided to each switch. These are in addition to the signals illustrated in FIG. 3B.

The arrangement of connecting lines allows a bus to turn a corner from vertical or horizontal wires or be rearranged or split using the M signals from multiplexers 97 of FIG. 9A. As can be seen in FIG. 9A, multiplexer 57 receives the X2 and X3 input signals, which can each be derived from length-one or length-four signals from any of the four directions. For example, in FIG. 9B, cells 12-11, 12-22, 12-33, and 12-44 could derive signals from the south and direct these signals to the east or west. Likewise, cells 12-41, 12-32, 12-23, and 12-14 can derive signals from switches to the west and direct these signals to the north or south. Cells not on the diagonal of the four-by-four block can fan out signals in two right angle directions. These turns are made without using up the length-one wires. This combination of connections adds only two horizontal metal lines per row of cells and two vertical metal lines per column of cells, so very little metal area is consumed. Further, the structure illustrated in FIG. 9B requires only one two-to-one multiplexer in each cell and thus consumes very little area. The routing flexibility from adding multiplexer 57 and its related output lines requires only one additional memory cell in the configuration memory. Multiplexer 57 reuses signals X2 and X3 generated by multiplexers 60 and 62. Many cell functions do not require both the X2 and the X3 multiplexers, some cells have unused function units, and a function unit might already have selected the desired input line to drive X2 or X3. Thus, there is a good chance of having an X2 or X3 multiplexer output signal which can be used by multiplexer 57 with no sacrifice to other parts of a user's design. The routing flexibility from adding multiplexer 57 and its related output lines also helps the routability of random logic designs.

At the edge of the chip, only two signals would be provided to switch 734, since no logic cells exist between switch 734 and the pads. However, in the embodiment of FIGS. 8–12, only one M signal is provided to switch 734.

FIG. 9C illustrates the arrangement of ME signals provided to switches 734 at the east edge of the chip. These are illustrated in FIG. 8 (east edge of the chip) as signals ME. Many other combinations are of course possible in other embodiments.

Register Protect Structure

Returning to FIG. 10, another feature of function unit FU achieves an important advantage. As discussed above, input signals X1, X2, and X3 are generated by user logic. Lines WORD, BIT0, $\overline{BIT0}$, BIT1 and BIT2, are part of the configuration memory programing structure for reading and writing the memory cells in the configuration memory and these lines can also be used to read and write registers 111 which are part of the user logic. A register protect multiplexer 104 can be programmed to select whether a signal from the user logic or a signal from the structure which controls configuration memory will be allowed to write to register 111. When register protect bit RP in configuration memory is logical zero, the combinatorial output from multiplexer 103 is forwarded to multiplexer 105 and can be loaded into register 111 in response to clock signal CLK. When the register protect bit RP is logical one, the Q output signal from register 111 is provided as input to multiplexer 105, which provides the D input to register 111. Thus the user logic, which generates the output signal from multiplexer 103 can not change the value in register 111. Even the clear signal CLR will not clear those registers which have their register protect bit RP set. In this mode, configuration memory access signals on lines WORD, BIT0, $\overline{BIT0}$, BIT1 and BIT2, can be used both to read and to write register 111. Thus an external CPU can have access to these registers while other portions of the FPGA are performing other functions and registers are being cleared with a global clear signal. Multiplexer 109, which receives both the combinatorial and sequential outputs of function unit FU allows an external CPU or other device to access the combinatorial output of multiplexer 103 as well as the output of register 111.

Connecting the WORD, BIT0, $\overline{BIT0}$, BIT1 and BIT2 lines to provide signals through the programmable switches to the user logic allows the user logic to detect and act on register accesses which are made through the configuration memory addressing structure.

Register Protect with Snapshot Feature

In some applications it is desirable to be able to take a snapshot of the state of an FPGA comprising both configuration information and the state of registers, save this snapshot in external memory, re-configure the FPGA to perform another task and then restore the snapshot of the state of the FPGA from the external memory so that the FPGA logic can start from where it left off. This is analogous to 'swapping in' and 'swapping out' a process on a conventional computer which has a multi-process operating system. So the term 'swapping out' can be used for saving the snapshot and 'swapping in' for restoring it. To make the snapshot feature possible when there is a register protect multiplexer 104 in every cell, it is necessary to be able to stop the Global Clock signal (GCLK) to the user logic without stopping the clock to the processor interface. In addition, all registers in the user logic must be clocked from GCLK and there must be no registers or latches built from gates in the user logic. It is necessary to turn off GCLK to the user logic because it will take many processor cycles to read the entire device state. If GCLK was not turned off, some state information would change during the read process and the saved values would not reflect a single clock cycle 'snapshot' of the user register states. Reads to registers and configuration memory locations can take place with the user logic clock off.

Figure 12:
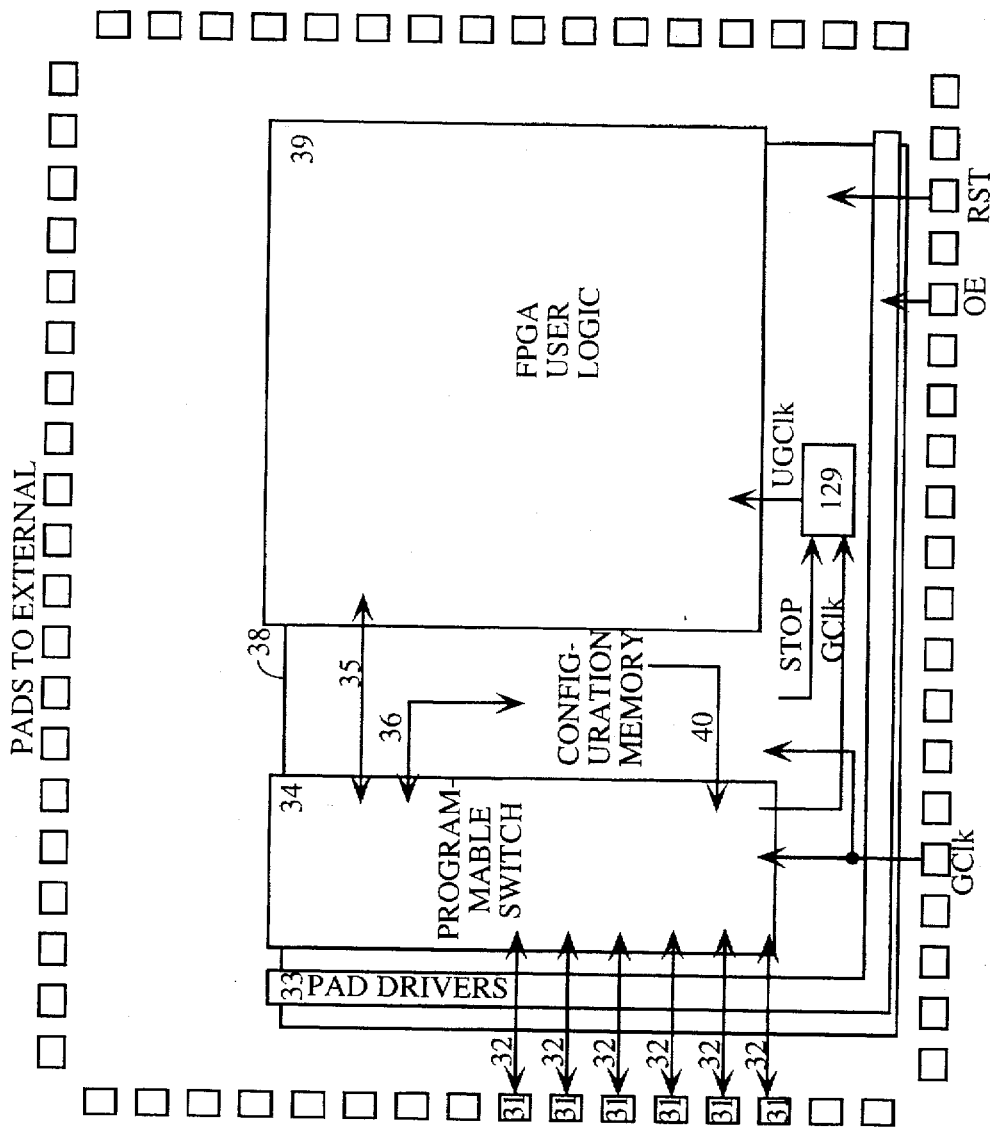
FIG. 12 illustrates a structure which provides a global clock signal from an external pad to a programmable switch and further provides the global clock signal to a gating device.
Figure 13A:
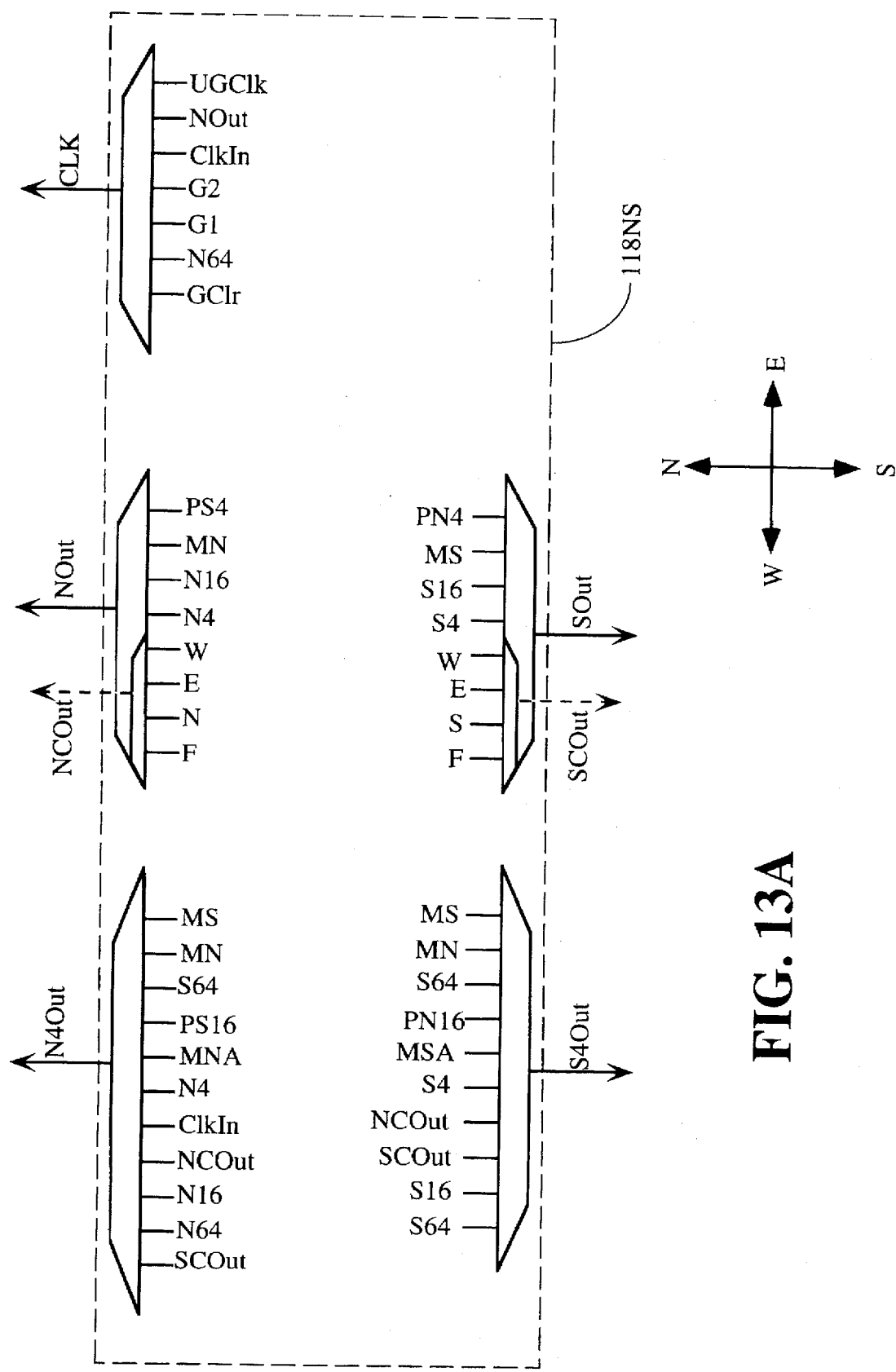
FIGS. 13A through 13D illustrate switches provided in one embodiment at locations throughout the user logic structure.

Thus a gated version of the global clock UGClk for driving user logic is provided. Stopping and starting UGCLK to the array must be done cleanly so that no spurious short pulses are produced. Circuits for doing this are well known in the art, and are not described here. In FIG. 12 the global clock signal GClk is provided to a gating structure 129, which generates a global user clock signal UGClk if the STOP signal is not asserted. This signal UGClk is shown in FIGS. 13A and 13C as a selectable source for the clock signal CLK which drives user registers shown in FIG. 10.

The following steps accomplish the Snapshot Feature:

Swapping Out

1. Turn off UGClk to the array.
2. Read configuration and state information through the configuration memory interface structure. The portion of configuration memory interface for reading state information to or from one user logic cell is shown in FIG. 10.

Swapping In

1. Set all RP=TRUE (configure memory to protect all registers). Setting all RP=TRUE can be done with one write cycle for the whole chip or a small number of write cycles for a given sub-area of the chip by using the wildcard addressing feature described in PCT application WO 94/10754. UGClk can be enabled or disabled because the values in the registers are to be overwritten.

2. Turn UGClk on. UGClk must be running to allow writes to registers since values are clocked into registers on the rising edge of CLK which is derived from UGClk.

3. Load register state through configuration memory interface. Even though UGClk is running, the register state will not be overwritten by user logic signals because register protect is set. Thus, although many clock cycles may be required to load the registers the registers will eventually hold the correct values for the swapped out states.

4. Turn UGClk off. Writes to configuration memory do not require UGClk to the array to be running. Turning off UGClk assures that register states will not be changed even though as the correct configuration is loaded many registers will have their register protect turned off.

5. Program the configuration memory.

6. Turn UGClk on.

Logic in the FPGA starts off with the previously swapped out configuration and state.

Padless Switches

Figure 11:
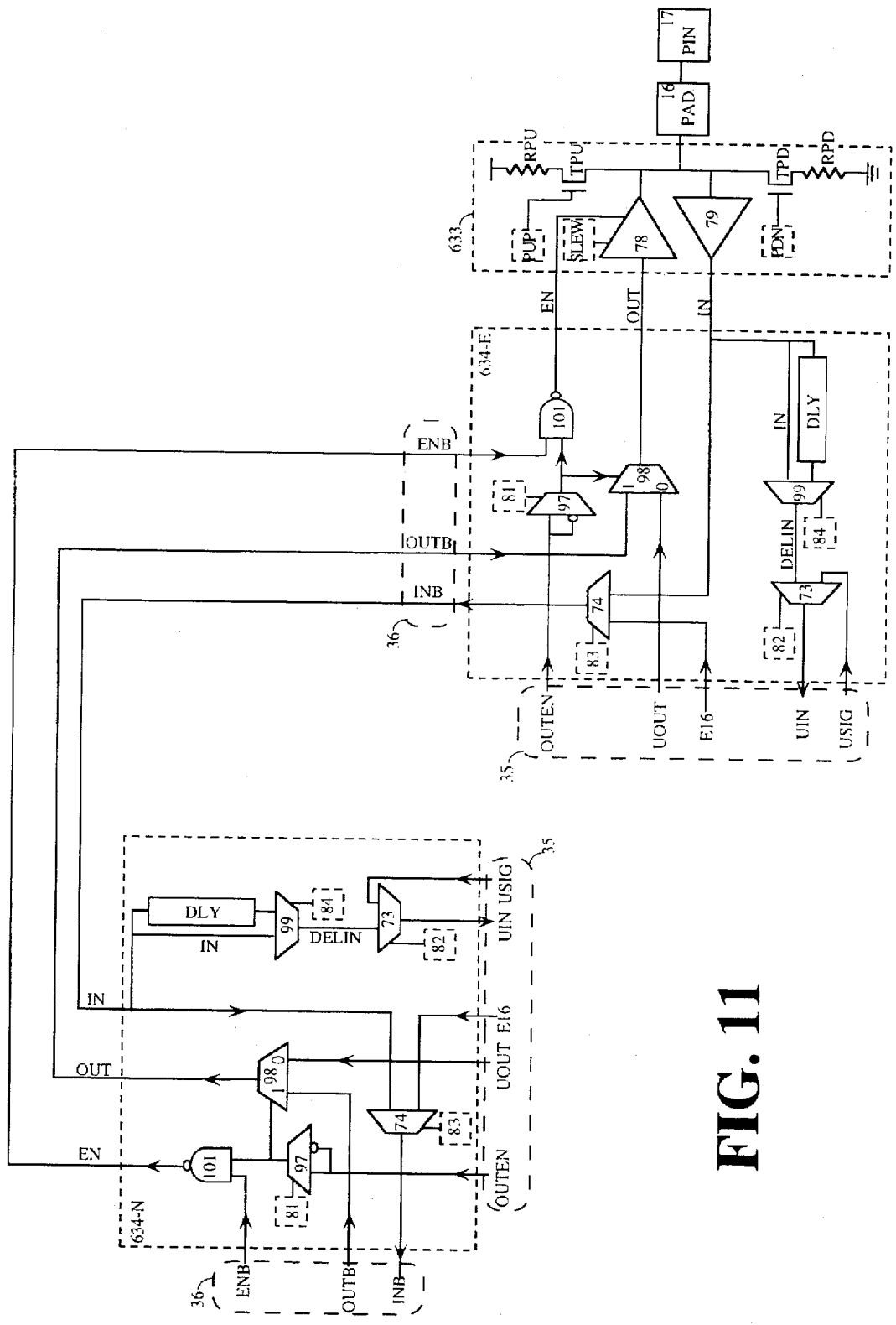
FIG. 11 shows a padless switch and its connections to a related switch and pad of the type shown in FIG. 7.

FIG. 11 shows two programmable switches which direct signals from a single pad 16. In FIG. 11, padless switch 634-N is at the north edge of the chip and programmable switch 634-E with pad 16 is at the east edge. The chip is arranged so that lines INB, OUTB, and ENB of switch 634-E connect to lines IN, OUT, and EN of switch 634-N. Thus switch 634-E can be used to direct signals either to its own lines of user logic or to switch 634-N which in turn directs signals either to its own lines of user logic or to its respective lines INB, OUTB, and ENB.

In order to avoid routing congestion, care must be taken to distribute padless switches around the chip and to distribute the programming address and data signals around the chip. In one implementation, there are 64 programmable switches on each edge of the chip, 64 pads on the north and south edges, and 57 pads on the east and west edges of the chip. There is a 32-bit data bus and a 16 bit address bus. In addition the chip receives or generates 14 control signals as follows:

read/write
chip enable
reset
serial mode load
wait
global clock
global clear
first global signal
second global signal
output enable
serial clock
serial clear
serial data
serial enable At the west edge of the chip, every second switch receives a data bus signal. At the east edge of the chip, sixteen of the switches, preferably not adjacent, receive address signals. At the south edge, fourteen of the switches receive control signals. The seven switches on the east edge and the seven switches on the west edge which do not have associated pads are connected to the secondary ports of switches on the south edge which have their secondary ports free. In this embodiment, all the north switches, 32 west switches, 48 east switches, and 36 south switches do not have their secondary ports used.

The serial and wait control signals listed above support a mode of loading configuration data from a serial bit stream and make the memory-addressable chip described above compatible with a bit stream method of loading supported by the XC17000 family of serial configuration PROMs available from Xilinx, Inc. Such loading methods are discussed at pages 2–231 to 2–238 of the Xilinx Data Book, ©1994, available from Xilinx, Inc., 2100 Logic Drive, San Jose, Calif. 95124.

Pads Which Are Input Only

The address pads, that is, those pads which are initially configured as address pads, do not receive output signals from the programming structure on bus 36 (FIG. 8 or FIG. 5) since addresses are input only. It may be simpler to design all programmable switches identically, thus providing OUTB and ENB lines as with bidirectional pads such as data pads. If the lines in bus 36 are input only, the OUTB and ENB lines of switch 734 are connected to power or ground and not left floating, so that when the pad is programmed to be an address or other input pad, output buffer 78 is always disabled.

Critical Signals such as Reset and Programming Clock

Certain signals which must be externally accessible for recovering from undesirable states may not be disconnectable from the programming logic. The reset signal is an example of such a signal. For such signals, the programmable switch may still programmably connect the signal from the pad to the user logic. If pad drivers are provided for such signals and are of the same design as pad drivers described above, the EN and OUT terminals of these pad drivers may be connected to ground (or to power if appropriate) so that the output drivers are permanently disabled.

This structure removes some flexibility of the programmable switch but assures that the function, such as reset or clock, is always accessible to external control.

FIG. 12 illustrates a structure which provides a global clock signal GClk from an external pad to programmable switch 34 and further provides the global clock signal GClk to a gating device 129 which as controlled by a STOP signal generated by the configuration memory control structure either toggles the user global clock signal UGClk or stops this clock signal while the external global clock signal GClk continues to toggle. Gating device 129 preferably receives additional signals to assure that no spurious pulses are applied to the user global clock signal UGClk. Such circuits are known and not described here. FIG. 12 illustrates an embodiment which provides the reset signal RST directly to configuration memory without the option of being directed elsewhere by programmable switch 34. FIG. 12 also indicates an embodiment in which an external output enable control signal OE controls pad drivers 33 directly without being programmable through programmable switch 34.

User Logic Switches Can Generate CLK and CLR

Figure 13B:
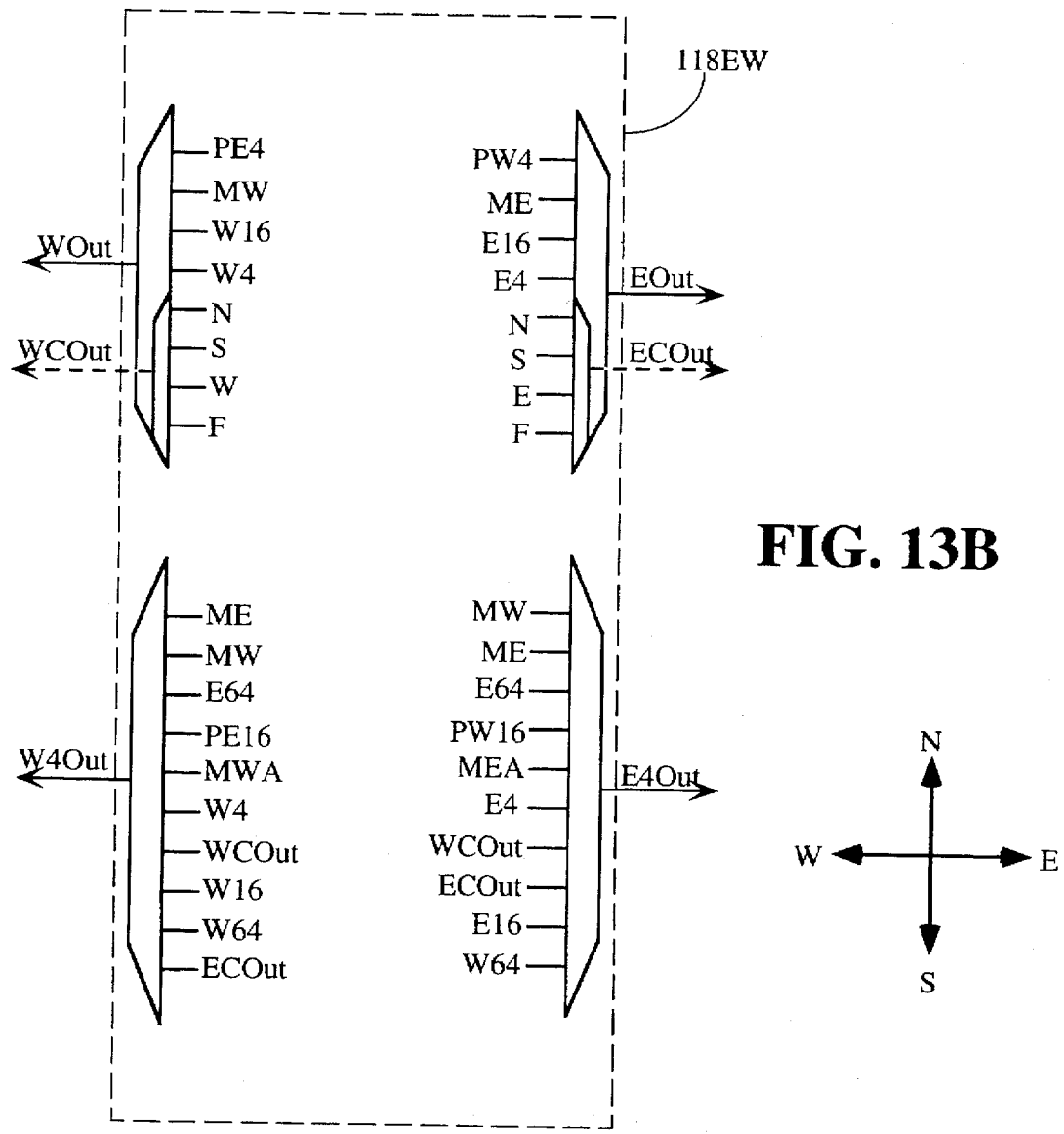
Figure 13C:
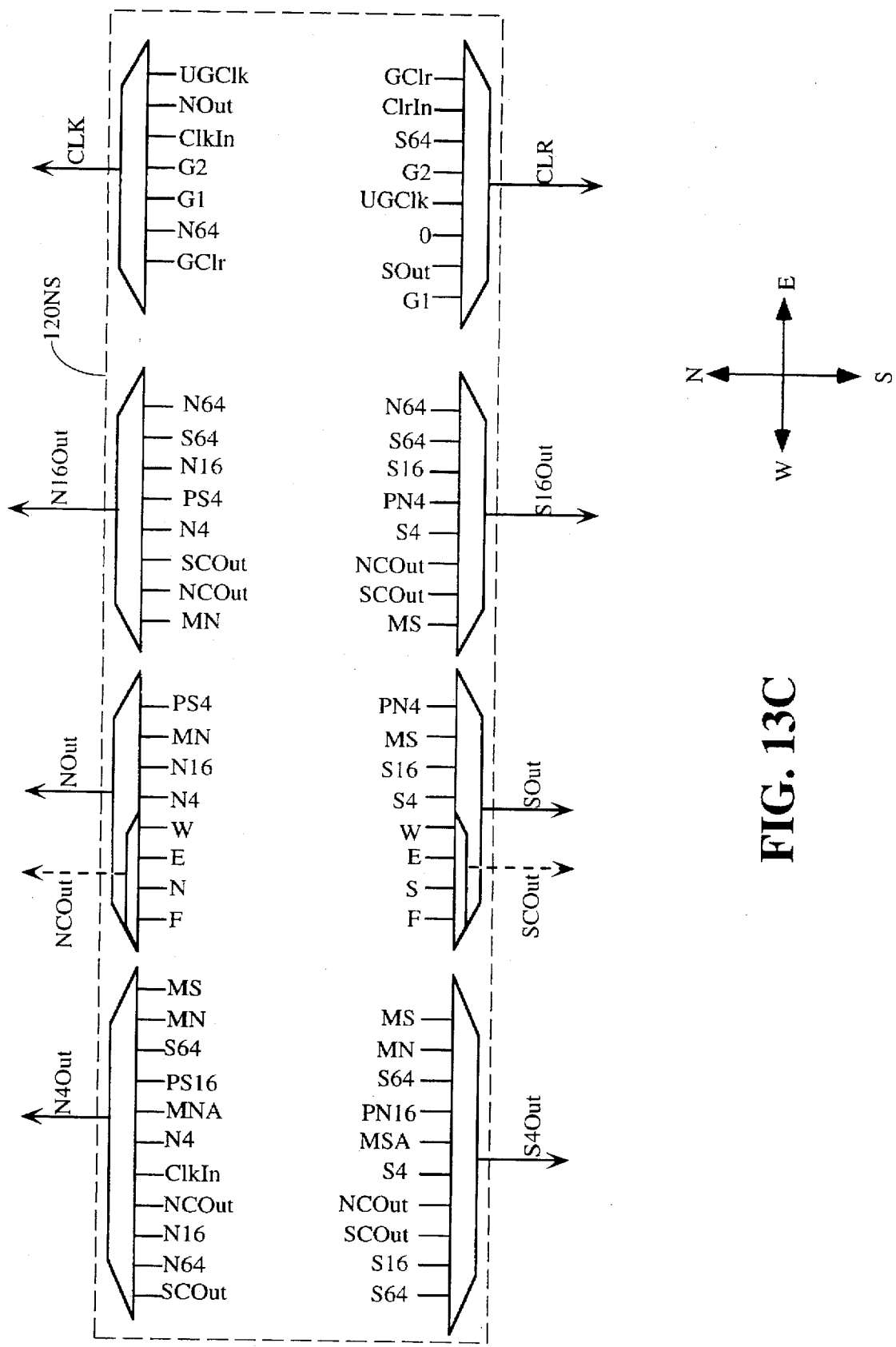
Figure 13D:
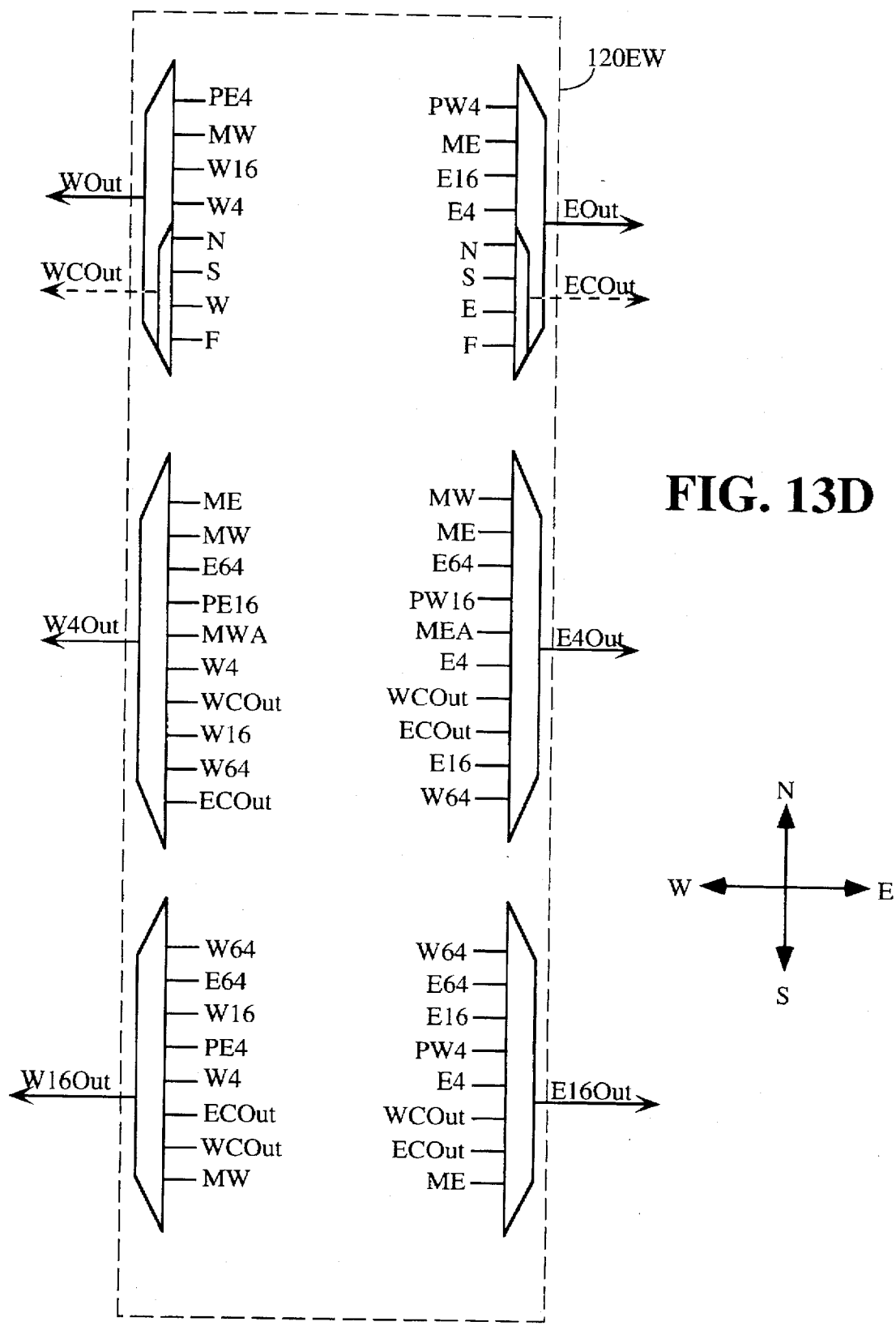

FIGS. 13A through 13D illustrate switches provided in one embodiment at locations throughout the user logic structure. FIG. 13A represents a north south switch 118NS on a north-south boundary between 4×4 groups of logic cells. Switch 118NS is similar to a switch 19 in FIG. 3B. Switches 118NS form horizontal boundaries between 4×4 groups of cells. FIG. 13B illustrates an east/west switch 118EW. Switches 118EW form east/west boundaries between 4×4 groups of cells and routes signals of various lengths as shown. In FIG. 13C, a north/south switch 120NS is illustrated. Switches 120NS form horizontal boundaries between 16×16 blocks of cells. Similarly, switches 120EW, of which one is illustrated in FIG. 13D, form vertical boundaries between 16×16 blocks of cells.

In a preferred embodiment, those portions of the switches of FIGS. 13A through 13D which are shown as having dashed line output signals are actually implemented as part of the neighboring logic cells shown in FIG. 9A and replace appropriate multiplexers in those neighboring cells.

In addition to routing signals of various lengths these switches generate certain control signals. In FIG. 13A, switch 118NS generates a clock signal CLK, which drives the clock input CLK of user registers shown in FIG. 10 and can be derived either from the global clear signal GClr or from the gated user global clock signal UGClk illustrated in FIG. 12. The clock signal CLK from one switch is also provided as the signal ClkIn to the next switch directly north. User generated signals can be used as clock signals via the NOut input to the CLK multiplexer, and a clock signal CLK generated in one 4×4 block of cells can be used to drive a clock input in a cell to the north of the 4×4 block.

FIG. 13C shows a switch 120NS at a horizontal boundary of a 16×16 block of cells. In addition to routing multiplexers and the CLK multiplexer discussed above, switch 120NS includes a clear multiplexer which generates the clear signal CLR. This signal is shown in FIG. 10 to be gated with the register protect signal in AND gate 107 to drive the reset input R of register 111 in a cell of user logic. As shown in FIG. 13C the clear signal CLR can be derived from a global clear signal GClr, from the clear signal generated in the block above ClrIn, from various routing signals, and from the global clock signal UGClk.

Some of the multiplexers in FIGS. 13A through 13D are shown as providing a second optional output signal. For example, in FIG. 13A, the SOut multiplexer also provides an optional SCOut signal and the NOut multiplexer provides an optional NCOut signal. FIGS. 13B, 13C and 13D also show multiplexers with an optional second output signal having a "C" designation. This C output corresponds to the output that comes from the cell's neighbor multiplexer in FIG. 9A. For example, in FIG. 13A, the NCOut signal is selected from the four signals F, N, E and W. Of the three select bits for controlling the eight-input NOut multiplexer, the two least significant bits also control the four-input NCOut multiplexer. Thus NOut will be identical to NCOut if the NOut multiplexer is set to select one of F, N, E or W. The same arrangement exists for the other multiplexers illustrated in FIGS. 13A through 13D as having a second output. The PS4 input to the NOut multiplexer is taken from the S4 signal to the cell to the north of the cell in which the NOut multiplexer is formed (not the S4Out signal from the illustrated switch). In every case the prefix "P" indicates the input signal comes from a previous cell (upstream from the direction of signal flow).

FIGS. 13A through 13D show only one embodiment of the invention. Clearly many alternative variations on these switches can be provided.

Serial Interface Structure

In the embodiment of FIGS. 8–12, the FPGA chip can be loaded through a serial interface as well as through an addressing structure. The serial interface structure makes the FPGA with addressable configuration memory compatible with serial PROMs available from Xilinx, Inc. The serial interface structure also allows the FPGA to use most pins for user input/output while a portion of the FPGA is being configured through a few pins.

The serial interface structure provides a method of configuring the configuration memory which is independent of the CE, read/write, address, and data pins and can therefore be used conveniently to load programming information for circuitry which affects those pins.

Six signals on six pins provide for the serial interface. The six signals are

| Serial | Selects between serial and parallel (addressable) modes of interface. (0 = serial, 1 = parallel) |
|---|---|
| Wait | controls transitions between states in serial mode. (0 = continue load, 1 = pause). The FPGA may also use an output pin driven by user logic to provide a Wait output signal for controlling slave FPGAs. |
| SEReset | Output signal resets serial PROM address counter. |
| $\overline{SECE}$ | Used by master FPGA to enable serial PROM output. |
| SEClk | Output from FPGA clocks serial PROM and slave FPGAs if present. |
| SEData | Serial configuration data for configuring the FPGA. |

The first signal, $\overline{Serial}$ selects between loading the configuration data through address and data lines as discussed earlier, and loading a bitstream through a single pin.

State Machine Representation of Serial Interface

Figure 14:
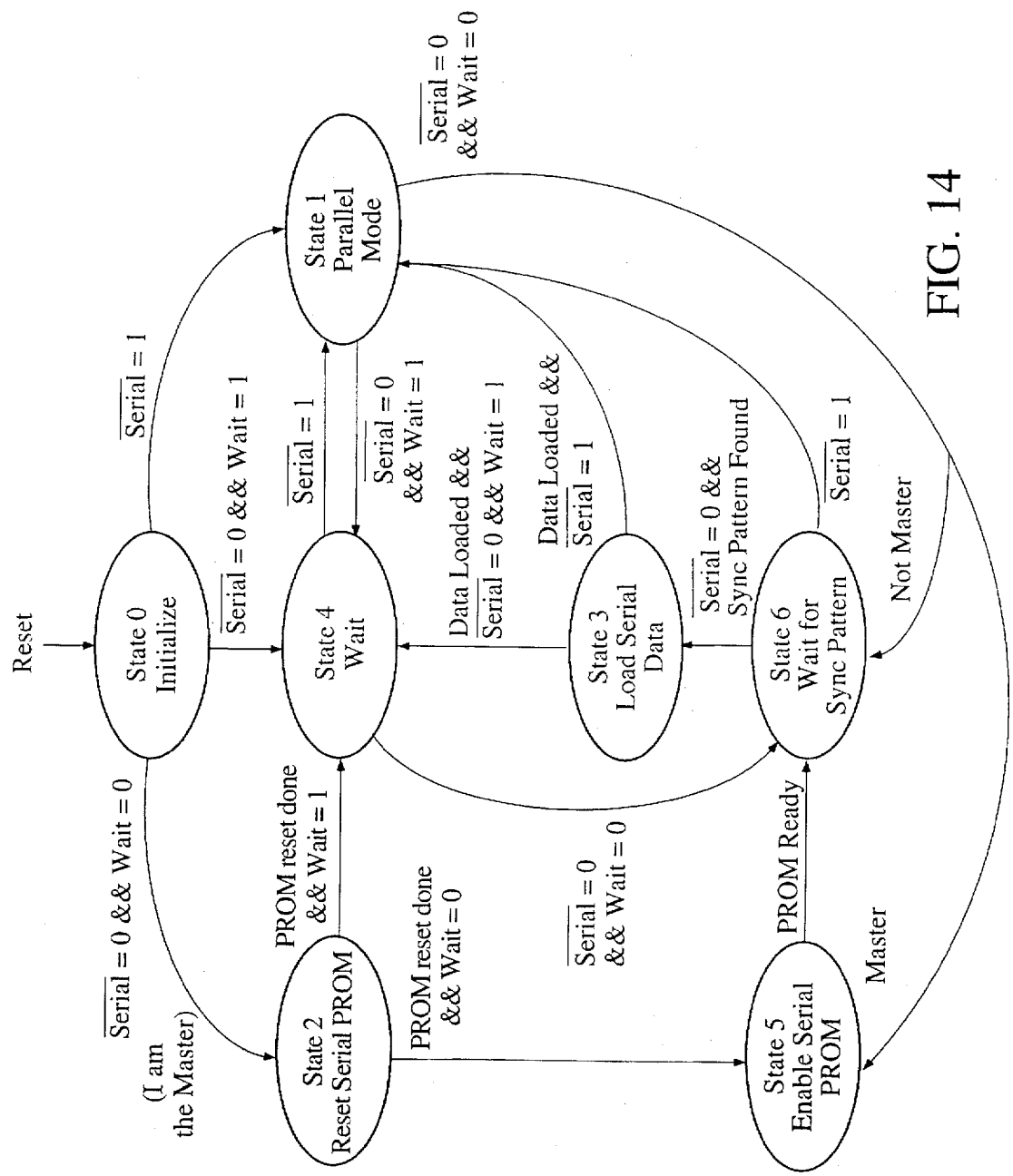
FIG. 14 shows a state machine representation of the operation of a serial interface structure with which the invention may be used.

FIG. 14 shows a state machine representation of the operation of the serial interface structure. State 0 occurs after a global FPGA Reset signal or upon power-up of the chip.

If $\overline{Serial}$ been set to 1, operation is in the parallel mode (State 1) in which address and data pins are used to load configuration data, as will be discussed below in connection with FIG. 17 and other figures.

If $\overline{Serial}$ has been set to 0, operation is in the serial mode and data are loaded as a serial bit stream. In one embodiment the bit stream includes both address and data information so that data may be loaded in any order, so that partial reconfiguration may be accomplished, and so that wild card and mask registers which allow more than one address to be loaded with the same data or allow less than a complete word to be loaded (discussed in PCT patent application WO 94/10754, mentioned above) can also be used.

If $\overline{Serial}$ is 0 and the Wait pin carries a 0, the FPGA prepares to be loaded with serial data. In response to $\overline{Serial}$=0 and Wait=0, all output buffers 78 (FIG. 8) are placed into a high impedance state and pads available to a user for parallel address, parallel data, and user logic signals are pulled high (In FIG. 8, transistor TPUP is turned on.) This is achieved by a global signal which overrides the memory cell signals and remains asserted until the device is configured, which is indicated by a decoded bit pattern in a register of configuration memory cells, discussed further below. Also in response to $\overline{Serial}$=0 and Wait=0, the FPGA drives SEReset high, then $\overline{SECE}$ low, then begins to toggle SEClk.

Driving SEReset high is represented by State 2 in FIG. 14. SEReset remains high for a sufficient number of cycles of the FPGA global clock to reset the serial PROM. SEReset is then deasserted.

Driving $\overline{SECE}$ low is represented by State 5. $\overline{SECE}$ remains low with SEClk not yet being toggled for at least a number of clock cycles sufficient to allow for the propagation delay between when the FPGA asserts the $\overline{SECE}$ signal and the valid data from the serial PROM propagates back to the FPGA, in one embodiment 11 cycles of the global FPGA clock. The number depends upon the fastest expected global clock frequency.

In State 6, SEClk begins to toggle. SEClk may be some portion of the global FPGA clock frequency, for example 1/16 or 1/2 the global clock frequency, and may be adjustable. The FPGA watches the serial data for a synchronization pattern, for example five zeros followed by a one, or several ones followed by a zero. To assure synchronization, the data stream may include, for example, seven ones followed by a zero while the FPGA watches for three ones followed by a zero.

When this synchronization pattern has been received, the device moves to State 3, and begins to load serial data SEData. Serial data are loaded in address/data pairs. After an address/data pair has been shifted into the FPGA, the address in the FPGA is selected, and the data are loaded into that address. This is the same operation which occurs when a parallel write occurs in parallel mode. The bits may be shifted in on the rising edge of SEClk.

Serial Timing

Figure 15:
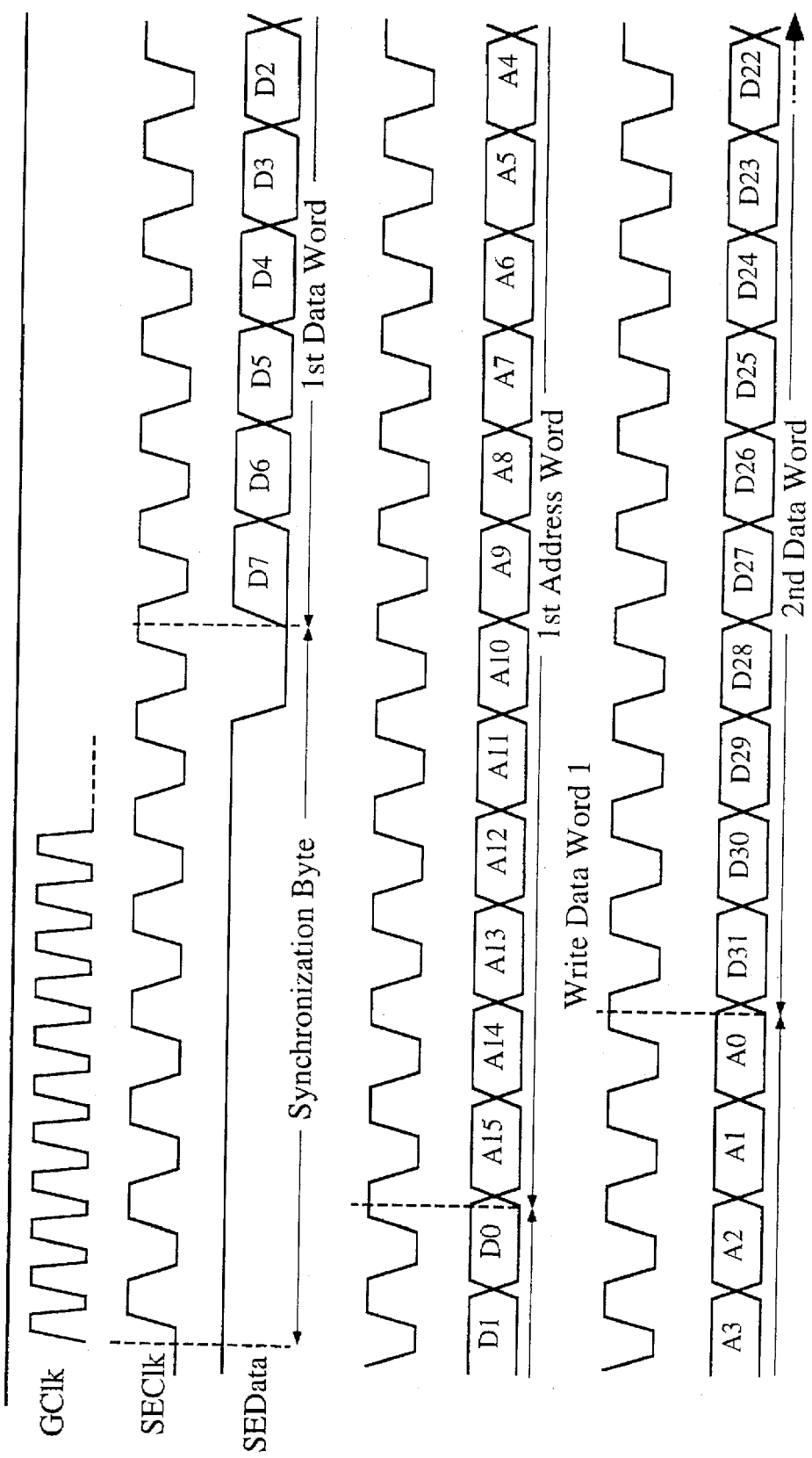
FIG. 15 shows a timing diagram illustrating the global clock signal GClk, the SEClk signal at half the global frequency, and the SEData signal for the serial interface of FIG. 14.

FIG. 15 shows a timing diagram illustrating the global clock signal GClk, the SEClk signal at half the global frequency, and the SEData signal for the serial interface of FIG. 14. The synchronization byte occurs at the beginning of SEData, and is followed by a first data word of 8 bits and an address of 16 bits. The serial interface structure allows serial data to be written to any configuration memory cell within the FPGA. This means a word can be loaded which changes the data word size or the SEClk rate for subsequent data. In the embodiment of FIG. 15, the data word size is initially 8 bits and the SEClk rate is initially set to 1/16 the global clock rate GClk.

The first 8-bit word loaded can be addressed to the configuration memory controlling the SEClk rate and modify it to be a faster rate. In one embodiment, the SEClk rate begins at 1/16 of the GClk rate and can be increased to, for example, 1/2 the global clock rate. Subsequent words are then loaded at this rate. The next data word can be addressed to the configuration memory cells controlling the data word length and modify the data word length to 32 bits. Subsequent words in the data stream are then loaded and written internally as 32-bit words. This leads to loading serial data at the fastest possible rate. In the embodiment illustrated in FIG. 15, the initial SEClk rate is 1/2 the GClk rate and remains at that rate. However, the length of the data word is switched from 8 bits after the first word to 32 bits, and this is the length of the second data word, as shown.

When data have been loaded, the Wait signal goes high. This may occur in two ways. First, the external Wait signal may be brought high and thus cause the corresponding internal Wait signal to go high. Second, a data-loaded bit at or near the end of the address/data pair may configure the programmable switch between the Wait pin and the Wait internal signal so that the Wait internal signal goes high.

Alternatively, if $\overline{Serial}$ goes high, the device moves to State 1 and continues in parallel mode. If Wait goes high, the FPGA moves to State 4 and remains there until the Wait signal is deasserted or the FPGA is shifted into parallel mode. Because of this Wait state, the structure can be partly loaded, perform some operation desired by the user, then further loaded with different configuration data, perform another operation, and so forth. $\overline{SECE}$ remains low (asserted) and SEClk toggles in states 3, 4, and 6.

Reset and Initialization

In one embodiment, when the FPGA is powered up or reset, all configuration memory is cleared, (therefore register protect feature is off) and the registers 111 within each logic cell are cleared. All I/O pads are disabled (output buffers 78 are disabled and pullup and pulldown transistors PUP and PDN are off).

On power up or after a reset pulse, the control memory must be set to a known value which ensures a low power consumption and sets the programmable switch so that external pads are coupled to the configuration memory addressing structure to permit the initial device configuration. Preferably, cell multiplexer decoding schemes are chosen so that coupling to the configuration memory addressing structure is achieved by writing 0 into all configuration memory cells. To avoid the possibility of a high power consumption caused by random values in the configuration memory persisting for some time, it is desirable that this initial clear operation operates asynchronously and does not depend on an external clock. Clearing all the configuration memory cells can be achieved by holding all bit lines at 0, all bitbar lines at 1 and all word lines at 1, thus writing 0 into all configuration memory cells simultaneously. This technique has one major problem: in the preferred embodiment of the invention there are more than 200 configuration memory cells per bit line. Theoretically all these configuration memory cells could hold '1' on power up or when Reset is applied. However, in that case, the bit line buffers would have to overcome 200 configuration memory cells in parallel. This would require impractically large bit line buffers. To avoid this problem the wildcard registers described in WO 94/10754 can be used in combination with fixed delay elements to turn the word lines on over a period of time. Initially one wildcard bit is set and 2 configuration memory cells are written. After a period of time (e.g. 50 ns), the second wildcard bit is set: 4 configuration memory cells are now selected, 2 of which are known to be 0 since they were previously written. This means the bit line buffers have very little load—in the worst case two configuration memory cells pull up and two pull down—the buffers need only 'tip' the balance. After 50 ns the next wildcard bit is set, now 8 configuration memory cells are selected, 4 of which are known to be 0. Again the bit line driver need only tip the balance—it does not need to drive 8 configuration memory cells simultaneously to the opposite state. Every 50 ns another column wildcard bit is set until all the word lines are high and the chip is cleared. At no stage do the bit line buffers have to flip more than two configuration memory cells simultaneously.

Figure 2:
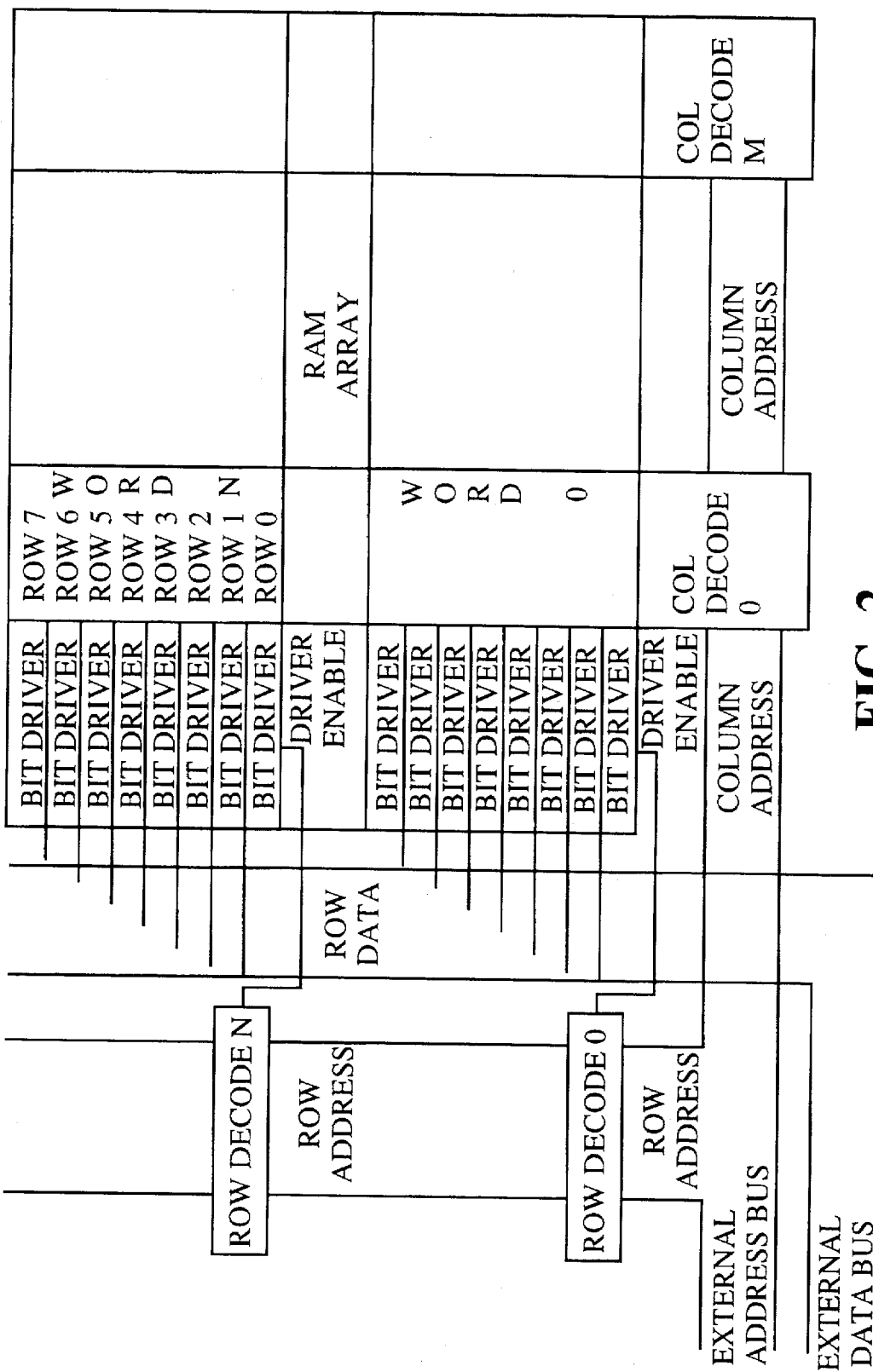
FIG. 2 shows the row and column address structure of the circuit of FIG. 1.

After reset is complete, an initialization sequence then occurs:

1) All control registers are cleared to disable all row and column wildcard features (for detail, see WO 94/10754). The global clock CLK which clocks registers 111 (FIG. 10) in the cells are disabled. Input buffers 79 (FIG. 8) are set to accept TTL logic thresholds. The data bus width (FIG. 2, WORD N) is set to 8 bits and the eight data bus bits are applied to all eight addressed registers. The serial configuration clock SEClk is set to 1/16 of the FPGA global clock frequency.

2) Function units FU within the cells 12 (FIG. 9A) are configured by multiplexers 109 (FIG. 10) to provide the Q output of registers 111. Since all configuration memory values are zero, the register protect feature is off. Since the clock is off, all function units output a constant zero.

3) All multiplexers 50, 52, 54, 56 in cells 12 (FIG. 9A) provide the output of function unit FU, and therefore all output a constant zero.

4) Except for the top row of cells, all multiplexers X1, X2, X3 in cells 12 select the N input, which is a constant zero.

5) Multiplexers 57 select the X3 output, which is constant zero.

6) Switches within the array each select an input which is a constant zero.

7) Global clear is asserted by initialization logic.

Figure 16:
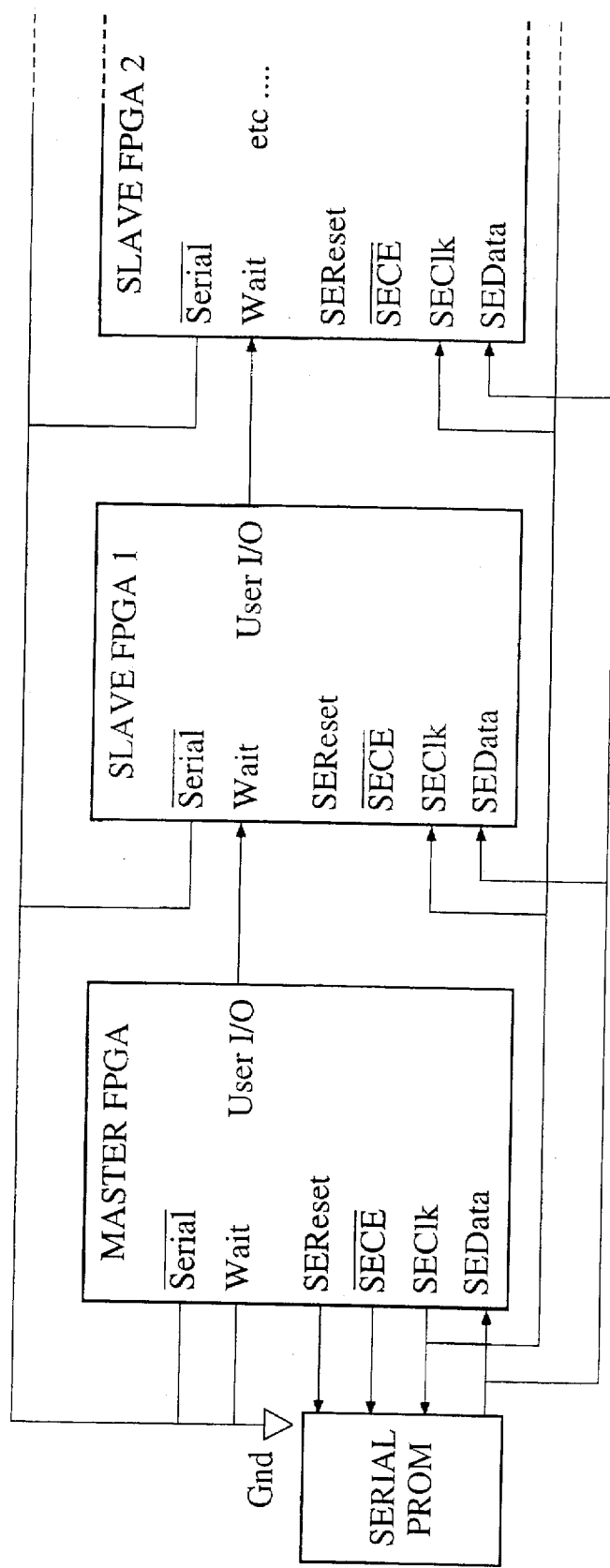
FIG. 16 shows several FPGAs connected to a printed circuit board so that they can be configured from a single serial PROM.

Example Application of the Serial Interface, FIG. 16

In the arrangement shown in FIG. 16, several FPGAs are connected to a printed circuit board so that they can be configured from a single serial PROM. When the board is powered up or the FPGA chips are reset, the above initialization sequence occurs. After this initialization sequence is complete, the following sequence of steps may be performed in order to configure the chip.

1) The master FPGA chip enters State 2 since Wait=0 and $\overline{Serial}$=0.

2) The slave FPGA chips enter State 4 since $\overline{Serial}$=0 and Wait=1.

3) The master enters State 2 and resets the serial PROM. The Slaves wait in State 4.

4) The master enters State 5 and enables the serial PROM.

5) The master enters State 6 and waits for a synchronization pattern.

6) The master enters State 3 and starts loading data.

7) The next to last data word to be loaded modifies the configuration memory which controls the programmable switch 34 of the Wait pin on the master FPGA so that the internal value of the Wait signal goes high. One more word is loaded after this write to configuration memory. The last word loaded into the master FPGA drives the User I/O pin high, which in turn drives the Wait input of slave FPGA 1 to a low, which causes slave FPGA 1 to enter State 6.

8) The master enters State 4 but still drives SEClk and $\overline{SECE}$ so that the slaves will be loaded. In State 6, slave FPGA 1 waits for a synchronization pattern.

9) When slave FPGA 1 receives a synchronization pattern, it enters State 3 and starts loading data.

10) As before, the next to last data word causes the value of the Wait signal to go high. As before, one more word is loaded after this write to configuration memory. The last word loaded into the master FPGA drives the User I/O pin high, which in turn drives the Wait input of slave FPGA 2 to a low, which causes slave FPGA 2 to enter State 6.

11) Steps 8–10 are repeated until the last slave FPGA in the chain is reached.

12) The last slave FPGA can simply return to parallel mode (State 1) and leave the master in State 4. If the master is also to be returned to parallel mode, the last slave must cause the programmable switch which drives the master's $\overline{Serial}$ input line to go high. There are a number of ways to do this. One way is for one I/O pin of the last slave FPGA to be connected to a pin of the master FPGA and for the programmable switch connected to this pin to direct the signal to drive the master's $\overline{Serial}$ input line high.

13) Finally, if the master's $\overline{Serial}$ input line is high, the master FPGA enters State 1, stops SEClk, and deasserts $\overline{SECE}$.

Figure 17:
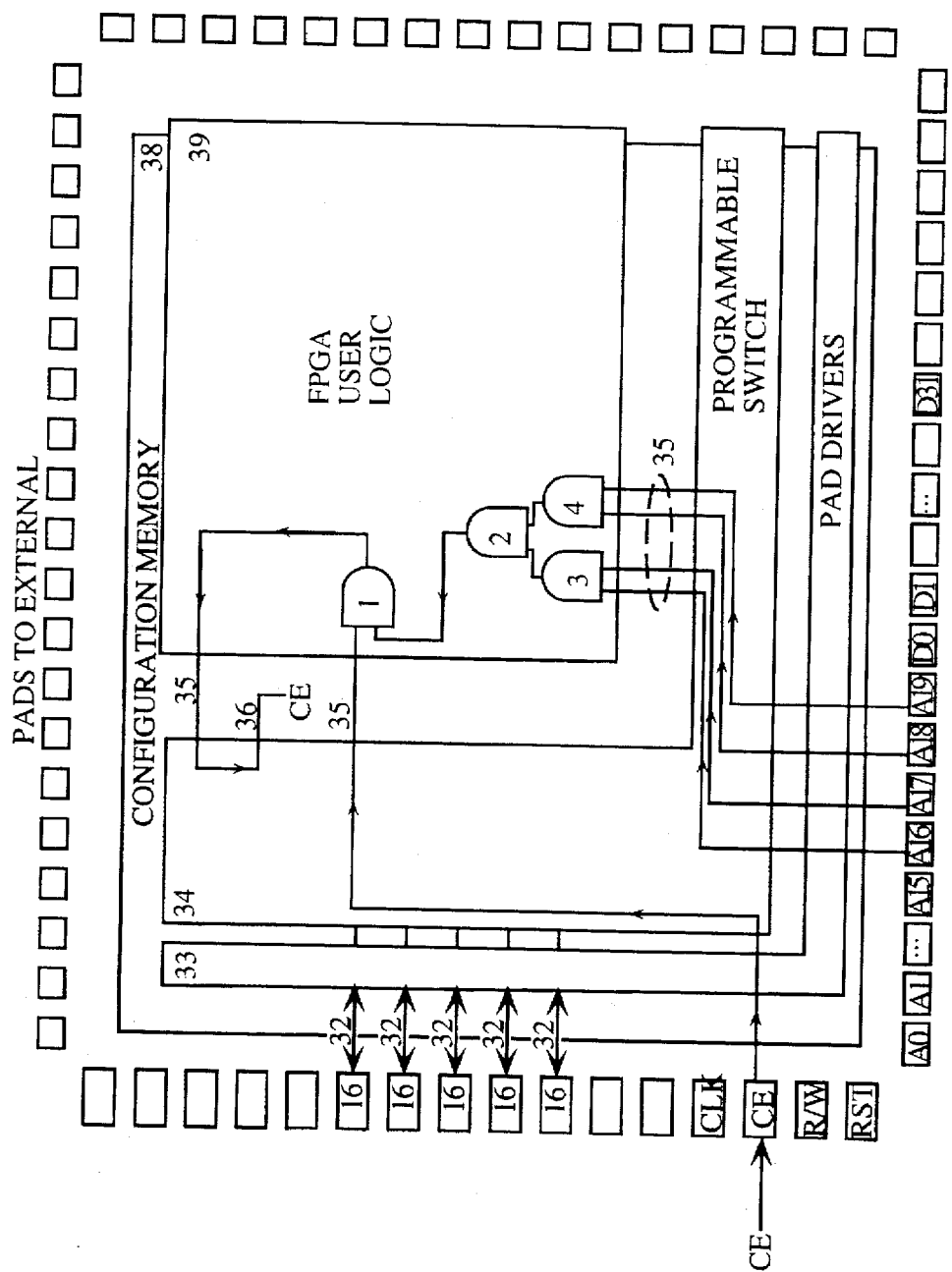
FIG. 17 shows an application of the programmable switch of the invention to modify a chip enable signal.

Example Application of the Programmable Switch, FIG. 17

FIG. 17 shows an example application which the user may make of the programmable switch of the invention. In this example, the user wishes to modify a chip enable signal CE so that the FPGA chip responds to the chip enable signal CE only when address lines A16 through A19 are high. This example application could not be so easily accomplished by the FPGA structures of the prior art. In fact, it would typically require that a PAL chip be provided on the board with the FPGA to decode the chip enable signal before providing it to the FPGA chip. With the present invention, this function can be accomplished within the FPGA chip.

This application is now explained using both FIG. 17 and FIG. 8. Looking at FIG. 17, the user loads bits into configuration memory 38, to cause FPGA user logic 39 to form AND gates 1–4. The user also loads configuration bits to cause the CE signal to be routed to AND gate 1 and the A16 through A19 signals to be routed to AND gates 3 and 4 as shown, preferably through the serial interface. Here, the serial interface allows the user to conveniently reconfigure those switches 734 connected to the CE and address pads, without having to use the CE and address pads to access the memory bits which control their own switches. The user programs configuration memory 38 to connect AND gates 1 through 4 together as shown, and to route the output signal from AND gate 1 to the CE line which controls configuration memory 38.

To route the signals in this manner makes use of programmable switch 34 comprising a plurality of switches 734. Programmable switch 34 is programmed to receive the CE signal from an external pad and apply it on bus 35 to an appropriate line leading into FPGA user logic 39. As shown in FIG. 17, the pad which is intended to receive the CE signal is at the west edge of the chip. However, to see the detail of a switch, we shall look at FIG. 8 and assume the CE pad is at the east edge of the chip. For this CE pad, (and other pads at the east edge of the chip) any of lines W, W16, or W64 may be selected to route the external CE signal by appropriately loading configuration memory cells which configure multiplexers 93, 95, and 96. Similarly, pads which receive address signals A16 through A19 are set to direct the signal to user logic 39 on bus 35, again through one of multiplexers 93, 95, and 96. The programmable switch which directs the CE signal to FPGA user logic 39 is also programmed to set multiplexer 74 so that the signal on line E16 is directed to line INB. Thus bus 35 carries the original CE signal to FPGA user logic 39 and then carries the modified CE signal back to switch 35 where it is directed by multiplexer 74 as the INB signal to the internal chip enable line CE which controls configuration memory 38.

Figure 1:
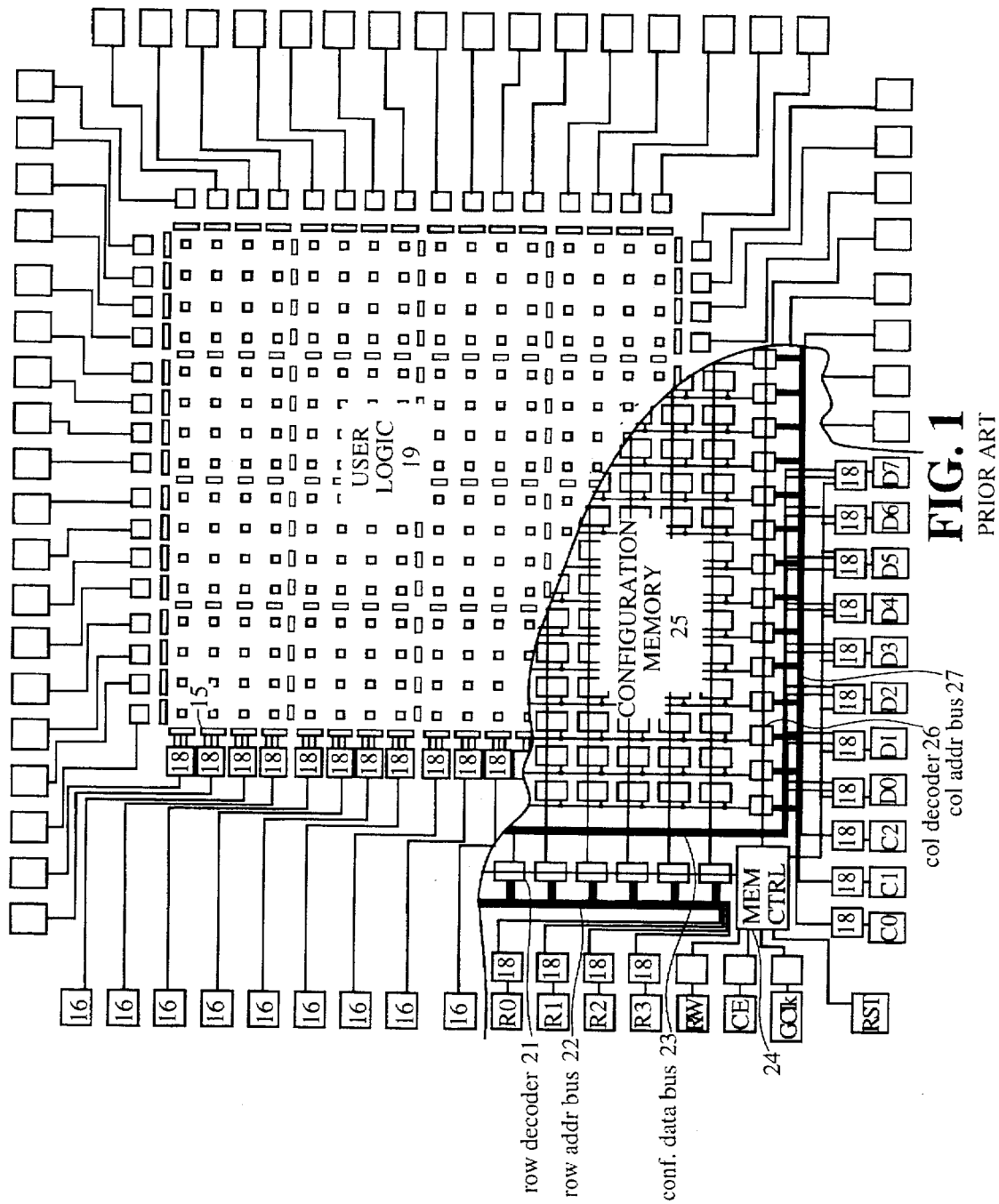
FIG. 1 shows one FPGA chip and the relationships between external pads, the FPGA user logic structures and the configuration memory which configures the user logic.

Note the contrast with FIG. 1, in which the chip enable signal CE is applied directly to memory control unit 24. In FIG. 1, if a user wishes to modify a chip enable signal, it is necessary to generate a modified chip enable signal before applying it to the CE pad of FIG. 1 or to perform the inefficient step of routing the CE signal onto the chip, generating a modified signal, routing the modified signal off the chip and back to the CE input pad of the chip, a much slower sequence, which uses additional I/O pins.

Another example application is to direct the read/write signal to the user logic and combine it with address signals before generating the internal read/write signal, so that only selected addresses can be rewritten after the initial configuration.

Yet another example is to disable the read access so that a user's design can not be decompiled by another user of the design. This function is similar to the "security fuse" on a PAL.

A further example is to connect a data pad to both user logic and to the programming circuitry which normally connects to this data pad. Then when a particular sequence of data signals is passed between the external pad and certain data lines, user logic can initiate an action. For example, by copying one area of the configuration memory to another, the user logic can reconfigure the device. Or the user logic can make simple changes to the configuration such as redirecting a multiplexer to receive a different signal, or copying an external data stream into part of the configuration memory.

Validation of Configuration Data

For FPGAs which can be programmed through both a serial interface and a parallel addressing structure, it is difficult to use a checksum or CRC check to verify that configuration data have been correctly loaded. It is convenient to provide another mechanism by which the device can know that the configuration is complete and is likely to be valid. The simplest method is to dedicate a single bit of configuration memory to mark a good configuration. The user could write to this bit upon completion. However, this method has the disadvantage that a hardware fault or software bug could result in writing the required bit value when the configuration is incorrect.

To assure greater reliability, and in particular to assure that the bitstream for another device type is not loaded, a larger register is provided which must receive characters which represent the name of the device manufacturer and the part family plus an identifier for the particular die revision. In one embodiment, this register includes 128 bits. Only if the correct values are present in all 128 bits will the output buffers and certain other elements be enabled. In another embodiment, by reading this or another register, a host computer determines the type of FPGA and adjusts its own behavior accordingly, for example by choosing one of several FPGA configurations to load.

In some cases, the FPGA may be able to function differently when one of several different strings of configuration data are loaded into this register. For example, if a bitstream for a previous less capable device, or a smaller family member is loaded, the FPGA may emulate the simpler device.

Figure 18A:
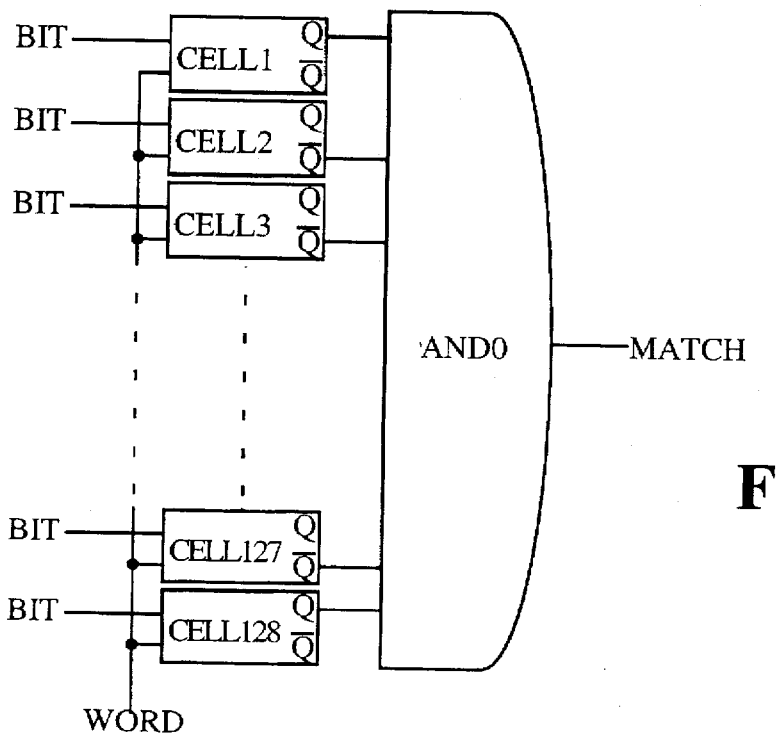
FIGS. 18A and 18B show two structures for validating configuration data.
Figure 18B:
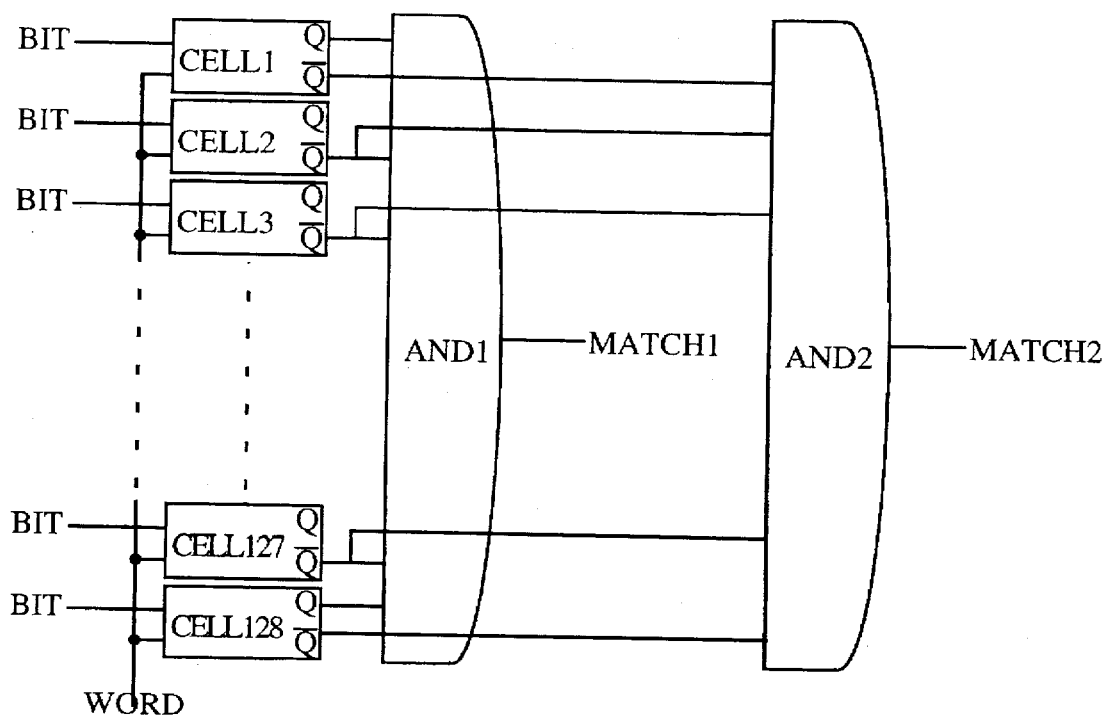

FIGS. 18A and 18B show two structures for validating configuration data.

In FIG. 18A, a set of 128 configuration bits are connectected to wide AND gate AND0. Some of the cells have their Q output connected to AND gate AND0 and some have their $\overline{Q}$ output connected. If the expected pattern includes a logical 0 in the bit position, the $\overline{Q}$ output is connected. If the expected pattern includes a logical 1 in the bit position, the Q output is connected. For example, in FIG. 18A, the Q output of CELL1 is connected to AND gate AND0 and the $\overline{Q}$ output of CELL2 is connected. A logical 1 output signal MATCH indicates a good configuration. A logical 0 indicates a failed configuration.

In FIG. 18B, a set of 128 configuration bits is again decoded. This time two AND gates AND1 and AND2 are provided and each decodes a different combination of logical 0's and logical 1's. For example, the Q output of CELL1 is connected to AND gate AND1 and the $\overline{Q}$ output of CELL1 is connected to AND gate AND2. The $\overline{Q}$ output of CELL2 is connected to both AND1 and AND2. Therefore AND gate AND1 provides a logical 1 MATCH1 signal in response to a different bit pattern than AND gate AND2. Since two acceptable bit patterns can be detected, the device can be programmed to respond differently to the two bit patterns. Clearly other devices than AND gates can be used to decode bit patterns, other numbers of bits can be used, different decoders can decode the output of different registers rather than the same register shown in FIG. 18B, and different decoders can decode different numbers of bits.

Though only specific embodiments of the present invention have been described here in detail, other embodiments will become obvious to those skilled in the art in light of the above description, and are intended to fall within the scope of the present invention.

We claim:

1. A random access serial interface structure in a field programmable integrated circuit chip comprising:

a data pad for loading configuration data through an external pin of said field programmable integrated circuit chip;

means for terminating the loading of data to said data pad; and means for reconfiguring said means for terminating the loading of data to said data pad.

2. A random access serial interface structure as in claim 1 further comprising:

a serial pad for applying an external signal to control whether said field programmable integrated circuit chip will load data through said data pad.

3. A random access serial interface structure as in claim 1 further comprising:

means for clocking the loading of data to said data pad from an external source.

4. A random access serial interface structure in a field programmable integrated circuit chip comprising:

a data pad for loading configuration data through an external pin of said field programmable integrated circuit chip;

means for converting a stream of data received on said data pad into an address word and a data word;

means for decoding said address word and applying said data word to a memory location indicated by said address; and means for determining that loading of said configuration data has been completed.

5. A random access serial interface structure in a field programmable integrated circuit chip comprising:

a configuration memory;

means for loading bits of data into said field programmable integrated circuit chip from an external data source;

means for converting a stream of bits loaded from said external data source to a parallel data word comprising an address field and a data field; and means for loading said parallel data field into a location in said configuration memory specified by said address field.

6. A random access serial interface structure as in claim 5 in which said means for loading said parallel data word into a location in said configuration memory comprises:

an addressing structure for loading data into said configuration memory; and means for applying said parallel data word to a set of data lines in said addressing structure addressed by an address in said stream of bits.

7. A serial interface structure in an integrated circuit chip comprising:

means for dividing a sequence of bits from a data stream into a data field and an address field;

means for loading data in said data field into a sequence of memory cells identified by said address field;

means for adjusting the length of said data field in response to data in a sequence of memory cells identified by a particular address in said address field and thereby adjusting:

the number of bits from said data stream which are divided into a data field and an address field, and the number of memory cells into which a sequence of bits from said data stream are loaded.

8. A serial interface structure as in claim 7 further comprising:

means for generating a clock signal, said clock signal controlling the rate at which bits in said data stream are provided to said integrated circuit chip;

means for adjusting the rate of said clock signal in response to bits in said data field which are loaded into a particular address identified by said address field.

9. A serial interface structure in an integrated circuit chip comprising:

means for loading data in a data stream into a sequence of memory cells;

means for generating a clock signal, said clock signal controlling the rate at which bits in said data stream are provided to said integrated circuit chip;

means for adjusting the rate of said clock signal in response to bits in said data stream which are loaded into a particular set of said memory cells.

10. A serial interface structure in an integrated circuit chip comprising:

means for loading data in a data stream through a programmable switch in said integrated circuit chip into memory cells of a configuration memory;

means for reprogramming said programmable switch in response to data in said data stream to terminate loading of said data.

* * * * *

UNITED STATES PATENT AND TRADEMARK OFFICE
CERTIFICATE OF CORRECTION

PATENT NO. : 5,737,235
DATED : April 7, 1998
INVENTOR(S) : Thomas A. Kean, et. al.

It is certified that error appears in the above-identified patent and that said Letters Patent is hereby corrected as shown below:

On the title page, item [73] Assignee: should read –Xilinx, Inc., San Jose, California.--

Signed and Sealed this

Ninth Day of May, 2000

Attest:

Q. TODD DICKINSON

*Attesting Officer*    *Director of Patents and Trademarks*